(12) United States Patent
Kobayashi et al.

(10) Patent No.: US 11,525,853 B2
(45) Date of Patent: Dec. 13, 2022

(54) TEMPERATURE TEST APPARATUS AND TEMPERATURE TEST METHOD

(71) Applicant: ANRITSU CORPORATION, Atsugi (JP)

(72) Inventors: Takeshi Kobayashi, Atsugi (JP); Tomohiko Maruo, Atsugi (JP); Yasuhiko Nago, Atsugi (JP)

(73) Assignee: ANRITSU CORPORATION, Atsugi (JP)

(*) Notice: Subject to any disclaimer, the term of this patent is extended or adjusted under 35 U.S.C. 154(b) by 190 days.

(21) Appl. No.: 16/986,918

(22) Filed: Aug. 6, 2020

(65) Prior Publication Data

US 2021/0055337 A1 Feb. 25, 2021

(30) Foreign Application Priority Data

Aug. 23, 2019 (JP) .............................. JP2019-152723

(51) Int. Cl.
*G01R 27/28* (2006.01)
*G01R 29/10* (2006.01)
(Continued)

(52) U.S. Cl.
CPC ............ *G01R 29/105* (2013.01); *G01K 1/14* (2013.01); *G01R 29/0864* (2013.01); *G05D 23/19* (2013.01)

(58) Field of Classification Search
CPC .. G01R 29/10; G01R 29/105; G01R 29/0814; G01R 29/0864; G01R 29/0871;
(Continued)

(56) References Cited

U.S. PATENT DOCUMENTS 6,114,985 A * 9/2000 Russell ................. G01S 7/4052
342/173
2018/0375593 A1* 12/2018 Elfstrom ............... H04B 17/101
(Continued)

FOREIGN PATENT DOCUMENTS

JP 2005347524 A 12/2005
JP 2008164424 A 7/2008
(Continued)

OTHER PUBLICATIONS

3GPP TR 38.810, V16.2.0; Mar. 2019; https://portal.3gpp.org/desktopmodules/Specifications/SpecificationDetails.aspx?specificationId=3218.

*Primary Examiner* — Thang X Le
(74) *Attorney, Agent, or Firm* — Greer Burns & Crain Ltd.

(57) ABSTRACT

A temperature test apparatus 1 includes a test antenna 6 configured to transmit or receive a radio signal to or from the antennas 110 in order to measure reception characteristics or transmission characteristics of the DUT 100, a heat-insulating housing 70 made of heat-insulating material surrounding a space region 71 including a quiet zone QZ, and a measuring device 20 configured to measure the transmission characteristics or the reception characteristics of the DUT 100. The heat-insulating housing 70 has a flat plate shaped part 70a in a region through which radio waves of a radio signal transmitted from the test antenna 6 passes before entering the quiet zone QZ. The flat plate shaped part 70a is perpendicular to the traveling direction of the radio waves of the radio signal entering the quiet zone QZ.

7 Claims, 14 Drawing Sheets

(51) Int. Cl.
*G01R 29/08* (2006.01)
*G05D 23/19* (2006.01)
*G01K 1/14* (2021.01)

(58) Field of Classification Search
CPC .............. G01R 29/0878; G01R 31/003; G01R 31/2822; G01R 31/2856; G01R 31/2874; G01R 31/2884; G01R 31/2889; G01R 31/2834; G01R 31/3025; G01R 31/31905; G01R 1/045; G01R 1/048; G01R 1/18; G01R 1/24
See application file for complete search history.

(56) References Cited

U.S. PATENT DOCUMENTS

| | | | |
|---|---|---|---|
| 2019/0109653 A1* | 4/2019 | Tankielun | G01M 99/002 |
| 2019/0212386 A1* | 7/2019 | Rowell | G01R 31/2874 |
| 2020/0025822 A1* | 1/2020 | Rowell | G01R 29/0821 |
| 2021/0318369 A1* | 10/2021 | Rehammar | H01Q 3/02 |
| 2021/0341528 A1* | 11/2021 | Sanchez Hernandez | H01Q 15/14 |

FOREIGN PATENT DOCUMENTS

| | | |
|---|---|---|
| JP | 2008166474 A | 7/2008 |
| JP | 2011019031 A | 1/2011 |
| JP | 2012080022 A | 4/2012 |
| JP | 2018223942 A | 6/2020 |

\* cited by examiner

|   | AntennaUnit | | | |
|---|---|---|---|---|
|   | Frequency | | | |
|   | Lower [GHz] | Upper [GHz] | 5G NR band | |
| 1 | 3.3 | 5.0 | n77 | 3.3~4.2 |
|   |     |     | n78 | 3.3~3.8 |
|   |     |     | n79 | 4.4~5.0 |
| 2 | 24.25 | 29.5 | n258 | 24.25~27.5 |
|   |       |      | n257 | 26.5~29.5 |
| 3 | 40.5 | 43.5 | n259 | 40.5~43.5 |
| ⋮ | ⋮ | ⋮ | ⋮ | ⋮ |

FIG.8

TEMPERATURE TEST APPARATUS AND TEMPERATURE TEST METHOD

BACKGROUND OF THE INVENTION

Field of the Invention

The present invention relates to a temperature test apparatus and a temperature test method for measuring temperature dependence of transmission characteristics or reception characteristics of a device under test by using an anechoic chamber in an OTA (Over The Air) environment.

Description of the Background Art

In recent years with the progress of multimedia wireless terminals (smartphones, and the like) in which antennas for wireless communication such as cellular and wireless LAN are mounted have been actively produced. In the future, wireless terminals that transmit and receive radio signals, particularly those compatible with IEEE 802.11ad, 5G cellular, and the like that use broadband signals in the millimeter wave band are required.

At wireless terminal design and development companies or their manufacturing plants, a performance test is performed on a wireless communication antenna included in a wireless terminal to determine whether or not a predetermined standard is satisfied by measuring output level and reception sensitivity of transmitted radio waves specified for each of communication standards.

With the generation shift from 4G or 4G advance to 5G, the test method of the above performance test is also changing. For example, in a performance test in which a wireless terminal for a 5G NR system (New Radio System) (hereinafter referred to as a 5G wireless terminal) is a device under test (DUT), the method of connecting the DUTs antenna terminals and a test apparatus by wire, which was the mainstream in 4G and 4G advance tests, cannot be used. This is because the characteristics are deteriorated by attaching the antenna terminals to the high frequency circuit, or because the number of elements of the array antenna is large and it is not realistic to attach the antenna terminals to all the elements in consideration of space and cost. For this reason, so-called OTA tests have been conducted, in which the DUT is housed together with a test antenna in an anechoic chamber that is not affected by a surrounding radio wave environment, and the test antenna transmits a test signal to the DUT and receives a signal under measurement from the DUT that received the test signal by wireless communication (see, for example. Japanese Patent Application No. 2018-223942).

As an OTA test environment, in addition to the tests at room temperature, temperature tests in which the temperature around the DUT is swung between a high temperature (for example, 55° C.) and a low temperature (for example, −10° C.) are required. At that time, in order to maintain the temperature around the DUT, a heat-insulating housing made of heat-insulating material is attached around the DUT. It is desirable that the heat-insulating housing has a structure that reduces deterioration of measurement results (degradation of the Quality of quiet zone) due to the heat-insulating housing itself. Here, the quiet zone is a concept that represents a range of a space region in which the DUT is irradiated from the test antenna with a substantially uniform amplitude and phase in an anechoic chamber that constitutes the OTA test environment (see, for example, 3GPP TR 38.810 V16.2.0 (2019 March)). The quiet zone is typically spherical in shape. By placing the DUT in the quiet zone, it becomes possible to perform the OTA test while suppressing the influence of scattered waxes from the surroundings.

SUMMARY OF THE INVENTION

In the OTA test the measurement is performed while rotating the DUT, so it is desirable to perform the test while rotating the DUT even in the state where the heat-insulating housing for the temperature test is attached, similarly to the test at room temperature without the heat-insulating housing. An existing temperature test apparatus has a structure in which the DUT is covered with a hemispherical heat-insulating housing in a test system (Distributed-axes system) where the DUT is placed on a turntable and the measurement is performed while a test antenna moves on a semicircle. In that configuration, as an antenna under test mounted in the DUT deviates from the center of rotation, the surface of the heat-insulating housing deviates from the perpendicular position with respect to the traveling direction of the radio waves transmitted and received between the test antenna and the antenna under test. As the traveling direction of the radio waves with respect to the surface of the heat-insulating housing becomes more inclined, the distance that the radio waves pass through the material of the heat-insulating housing becomes longer, and the ratio of specular reflection increases.

In other words, in the above existing structure, the more the antenna under test deviates from the rotation center, the worse the deterioration of the measurement results due to the heat-insulating housing (the deterioration of the Quality of quiet zone). This means that there was a problem that the above existing structure is not suitable for testing a terminal such as a tablet, which has a relatively large size and the locations of its antennas under test are unknown, by the so-called "black box" method (black box approach).

The present invention has been made in order to solve such a conventional problem, and an object thereof is to provide a temperature test apparatus and a temperature test method capable of suppressing deterioration of measurement results due to a heat-insulating housing when measuring temperature dependence of transmission characteristics or reception characteristics of a device under test in an OTA test environment.

In order to solve the above-mentioned problem, a temperature test apparatus according to the present invention for measuring temperature dependence of transmission characteristics or reception characteristics of a device under test having one or mere antennas under test comprises: an anechoic chamber having au internal space unaffected by a surrounding radio wave environment; a test antenna housed in the internal space and configured to transmit or receive a radio signal to or from the antenna under test in order to measure the reception characteristics or the transmission characteristics of the device under test; an orientation changing mechanism configured to sequentially change an orientation of the device under test placed in a quiet zone in the internal space; a heat-insulating housing housed in the internal space and made of heat-insulating material surrounding a space region including the quiet zone; a temperature control device capable of controlling temperature of the space region; and a measuring device configured to measure the transmission characteristics or the reception characteristics of the device under test wherein the heat-insulating housing has a flat plate shaped part in a region through which radio waves of a radio signal transmitted from the test antenna passes before entering the quiet zone, the flat plate shaped part being perpendicular to the traveling direction of the radio waves of the radio signal entering the quiet zone.

As described above, in a region of the heat-insulating housing through which radio waves of a radio signal transmitted from the test antenna passes before entering the quiet zone, a flat plate shaped part perpendicular to the traveling direction of the radio waves of the radio signal entering the quiet zone is formed. With this configuration, the traveling direction of the radio waves exchanged between the test antenna and the antennas under test is always perpendicular to the flat plate shaped part of the heat-insulating housing regardless of the positions of the antennas under test in the device under test. Therefore, compared with the case where the traveling direction of the radio waves with respect to the flat plate shaped part of the heat-insulating housing is oblique, the distance through which the radio waves passes through the heat-insulating housing becomes the shortest, and the absolute value of the reflection coefficient is minimum for the TE-polarized component of the plane waves incident on the flat plate shaped part of the heat-insulating housing. Therefore, the temperature test apparatus according to the present invention can suppress radio wave loss due to absorption and reflection in the heat-insulating housing of which radio waves passing through, and uncertainty of radio wave intensity due to interference by reflected waves, when measuring the temperature dependence of the transmission characteristics or the reception characteristics of the device under test in the OTA test environment. This allows the temperature test apparatus according to the present invention to suppress the deterioration of the measurement results (the deterioration of the Quality of quiet zone) due to the heat-insulating housing.

In the temperature test apparatus according to the present application, the measuring device measures the transmission characteristics or the reception characteristics of the device under test every time the orientation of the device under test is changed by the orientation changing mechanism while the temperature of the space region is controlled by the temperature control device.

In the temperature test apparatus according to the present application, the orientation changing mechanism comprises: a drive unit configured to generate rotational diving force; a turntable configured to rotate by a predetermined angle around one of two axes that are orthogonal to each other by the rotational driving force of the drive unit; a support column extending from the turntable in the direction of the one axis and rotating together with the turntable by the rotational driving force of the drive unit; and a DUT mounting part on which the device under test is mounted, which extends from a side surface of the support column in the direction of the other of the two axes, and rotates by a predetermined angle around the other axis by the rotational driving force of the drive unit.

With this configuration, the temperature test apparatus according to the present invention is provided with foe orientation changing mechanism as a 2-axis positioner so that the device under test can be sequentially rotated with the center of the device under test as the center of rotation, thereby making it possible to have the antennas under test oriented in all three-dimensional directions.

In the temperature test apparatus according to the present application, the heat-insulating housing comprises: a disk-shaped rotating part having a through hole into which a part of the support column is inserted and rotating together with the turntable and the support column; and a hole part having an inner diameter substantially equal to an outer diameter of the rotating part and rotatably accommodating the rotating part; wherein friction reducing parts are provided on a side wall surface of the rotating part facing the hole part and on an inner wall surface of the hole part facing the rotating part to reduce friction between the side wall surface and the inner wall surface.

With this configuration, the temperature test apparatus according to the present invention is provided with the friction reducing parts at a position where the rotating part and the hole part are in contact with each other, so that the temperature test apparatus can prevent the durability of the heat-insulating housing from being deteriorated due to the friction between the rotating part and the hole part during rotation.

The temperature test apparatus according to the present application further comprises: a reflector housed in the internal space and having a predetermined surface shaped as paraboloid of revolution; wherein the reflector reflects radio waves of a radio signal on the surface shaped as paraboloid of revolution, the radio waves of the radio signal being transmitted and received between the antennas under test and the test antenna arranged at the focal position defined by the paraboloid of revolution.

With this configuration, the temperature test apparatus according to the present invention has the reflector having the predetermined surface shaped as paraboloid of revolution arranged in the radio wave propagation path between the antennas under test and the test antenna, so that the OTA test can be executed with a more compact structure than the OTA test in the direct far-field method in which the test antenna and the device under test face each other to transmit and receive signals.

A temperature test method using a temperature test apparatus for measuring temperature dependence of transmission characteristics or reception characteristics of a device under test having one or more antennas under test, wherein the temperature test apparatus comprises: an anechoic chamber having an internal space unaffected by a surrounding radio wave environment; a test antenna housed in the internal space and configured to transmit or receive a radio signal to or from the antennas under test in order to measure the reception characteristics or the transmission characteristics of the device under test, an orientation changing mechanism configured to sequentially change an orientation of the device under test placed in a quiet zone in the internal space; a heat-insulating housing housed in the internal space and made of heat-insulating material surrounding a space region including the quiet zone; a temperature control device capable of controlling temperature of the space region; and a measuring device configured to measure the transmission characteristics or the reception characteristics of the device under test; wherein the heat-insulating housing has a flat plate shaped part in a region through which radio waves of a radio signal transmitted from the test antenna passes before entering the quiet zone, the flat plate shaped part being perpendicular to the traveling direction of the radio waves of the radio signal entering the quiet zone, the temperature test method comprising: a temperature control step of controlling the temperature of the space region; an orientation changing step of sequentially changing the orientation of the device under test placed in the quiet zone; and a measurement step of measuring the transmission characteristics or the reception characteristics of the device under test every time the orientation of the device under test is changed by the orientation changing step while the temperature of the space region is controlled by the temperature control step.

With this configuration, the temperature test method according to the present invention can measure the temperature dependence of the transmission characteristics or the reception characteristics of the device under test in the OTA test environment while suppressing the deterioration of the measurement results due to the heat-insulating housing.

The present invention provides a temperature test apparatus and a temperature test method capable of suppressing deterioration of measurement results due to a heat-insulating housing when measuring temperature dependence of transmission characteristics or reception characteristics of a device under test in an OTA test environment.

BRIEF DESCRIPTION OF THE DRAWINGS

FIG. 8 is a table showing frequency band classification of a plurality of test antennas for measuring the transmission and reception characteristics of the PUT used in the OTA chamber of the temperature test apparatus according to the embodiment of the present invention.

DETAILED DESCRIPTION OF THE INVENTION

Embodiments of a temperature test apparatus and a temperature test method according to the present invention will be described below with reference to the drawings. The dimensional ratio of each component on each drawing does not necessarily match the actual dimensional ratio.

Figure 1:
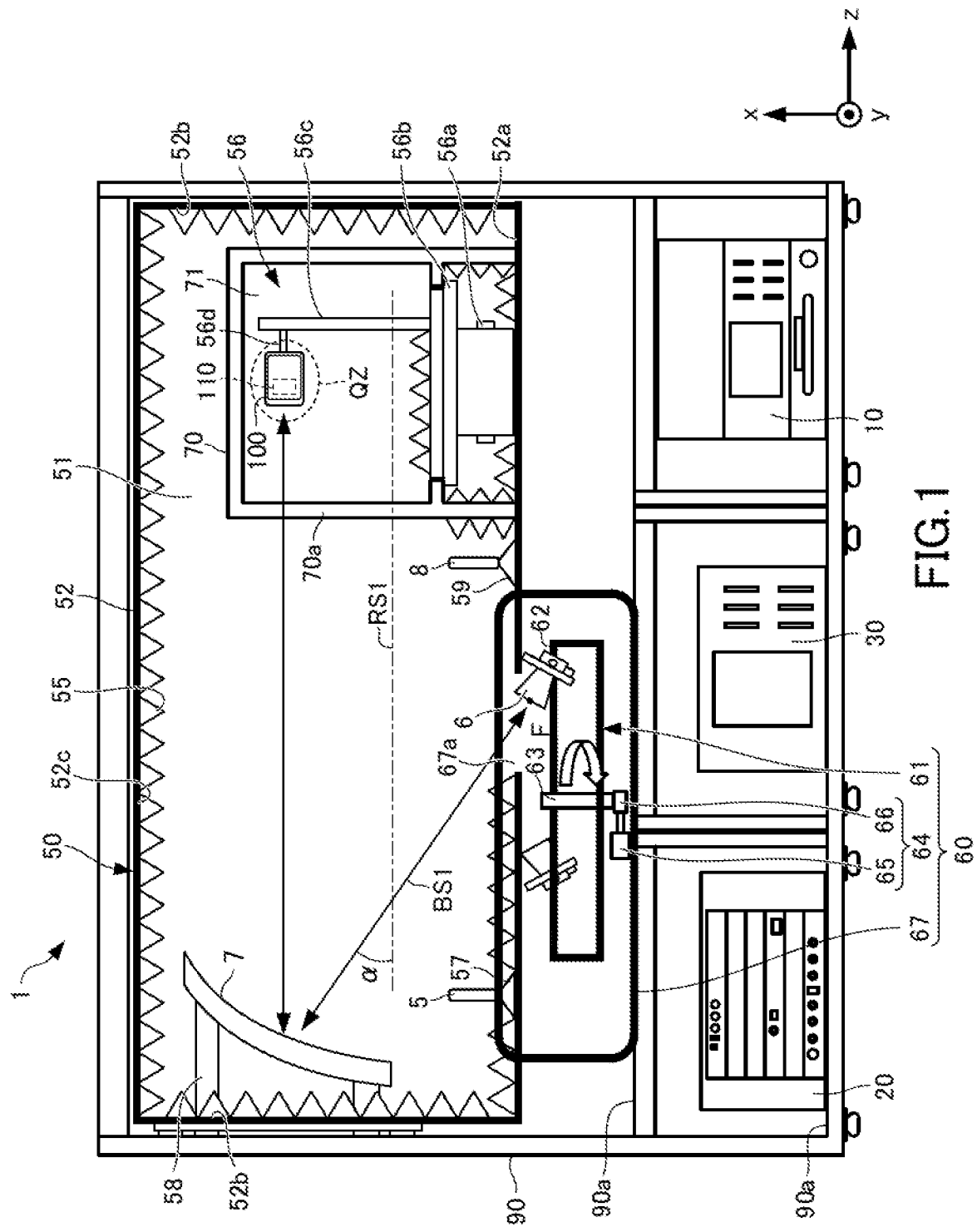
FIG. 1 is a diagram showing a schematic configuration of an entire temperature test apparatus according to an embodiment of the present invention.
Figure 2:
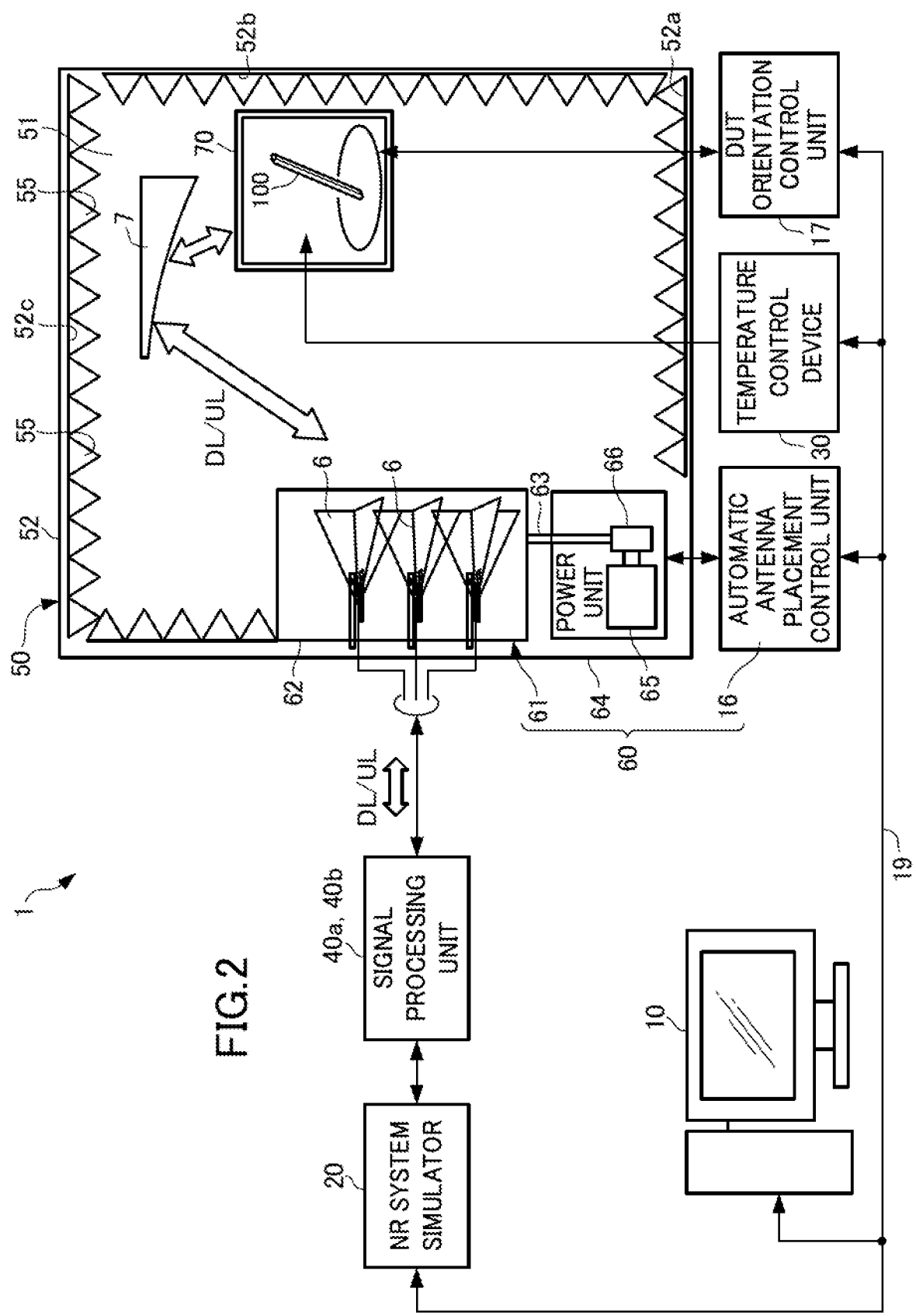
FIG. 2 is a block diagram showing a functional configuration of the temperature test apparatus according to the embodiment of the present invention.

The temperature test apparatus 1 according to the present embodiment measures temperature dependence of transmission characteristics or reception characteristics of the DUT 100 having the one or more antennas 110, and has an appearance structure as shown in FIG. 1 as a whole and is composed of functional blocks as shown in FIG. 2. However, FIG. 1 shows an arrangement mode of each component in a state where the OTA chamber 50 is seen through from the side.

As shown in FIGS. 1 and 2, the temperature test apparatus 1 according to the present embodiment includes an integrated control device 10, an NR system simulator 20, a temperature control device 30, signal processing units 40a and 40b, and an OTA chamber 50.

The integrated control device 10 is communicably connected to the NR system simulator 20 and the temperature control device 30 via a network 19 such as Ethernet (registered trademark). Further, the integrated control device 10 is also connected via the network 19 to control means for controlling the components arranged in the OTA chamber 50. The temperature test apparatus 1 has, as the control means for the OTA chamber 50, an automatic antenna placement control unit 16 and a DUT orientation control unit 17.

Figure 3:
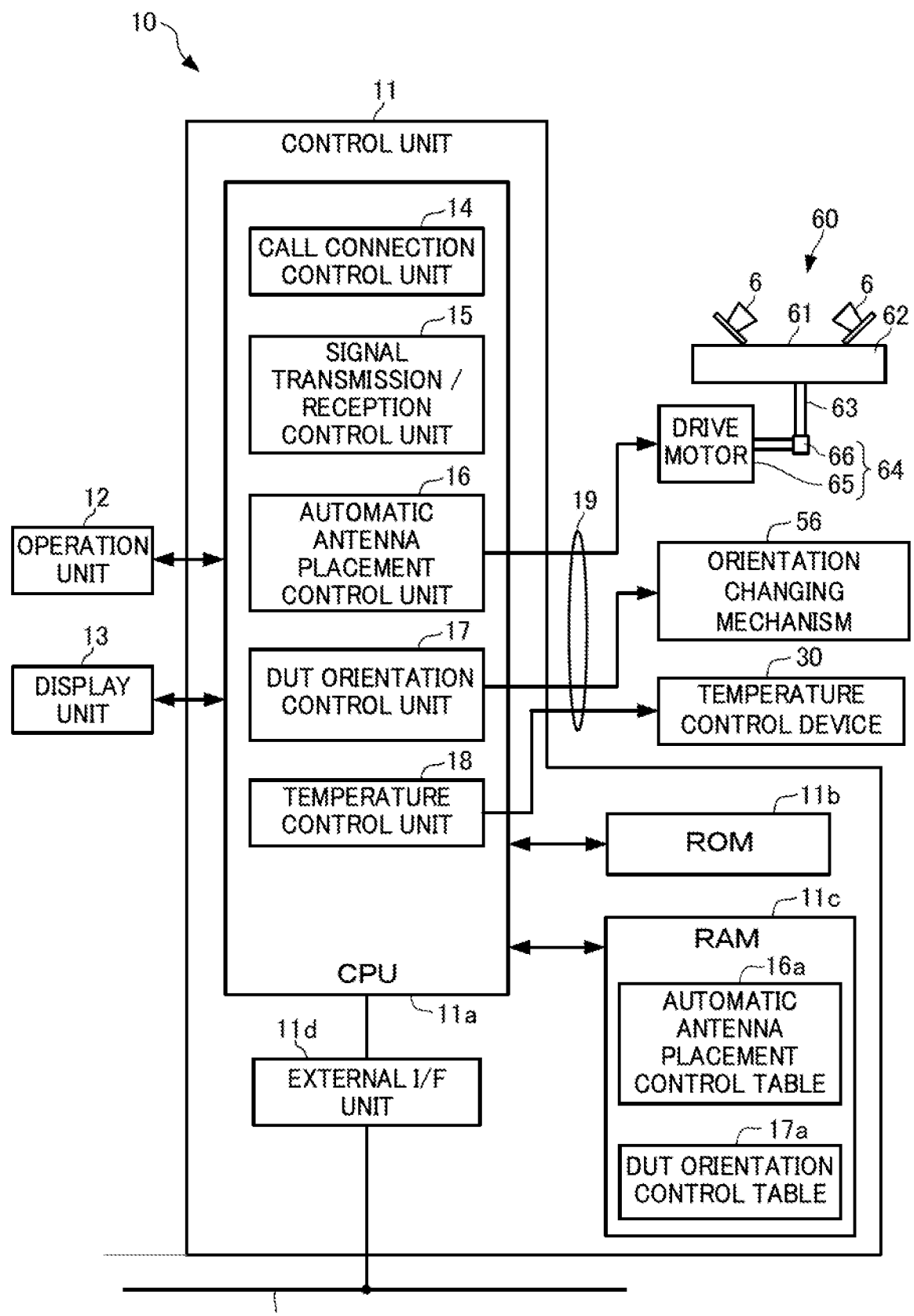
FIG. 3 is a block diagram showing a functional configuration of the integrated control device of the temperature test apparatus according to the embodiment of the present invention.

The integrated control device 10 integrally controls the control means for the NR system simulator 20, the temperature control device 30, and the OTA chandler 50 via the network 19, and is composed of for example, a personal computer (PC). The automatic antenna placement control unit 16, the DUT orientation control unit 17, and a temperature control unit 18 that controls the temperature control device 30 may be provided in the integrated control device 10 as illustrated in FIG. 3, for example. Hereinafter, the integrated control device 10 will be described as having the configuration shown in FIG. 3.

The temperature test apparatus 1 is operated, for example, using a rack structure 90 having a plurality of racks 90a as shown in FIG. 1 and placing each component on each rack 90a. FIG. 1 shows an example in which the integrated control device 10, the NR system simulator 20, the temperature control device 30, and the OTA chandler 50 are mounted on each rack 90a of the rack structure 90.

Here, for convenience, the configuration of the OTA chamber 50 will be described first. The OTA chamber 50 realizes an OTA test environment for a performance test of 5G wireless terminals and is used as an example of a compact antenna test range (hereinafter, referred to as CATR).

As shown in FIGS. 1 and 2, the OTA chamber 50 is composed of, for example, a metal housing body 52 having a rectangular parallelepiped internal space 51, and accommodates the DUT 100 and a test antenna 6 feeing the antennas 110 of the DUT 100 in the internal space 51 in a state of preventing intrusion of radio waves from the outside and emission of the radio waves to the outside. As the test antenna 6, for example, a millimeter wave antenna having directivity such as a horn antenna can be used. Note that the number of test antennas 6 may be one, but in the following description, there will be a plurality. The test antenna 6 transmits or receives a radio signal for measuring the transmission characteristics or the reception characteristics of the DUT 100 to or from the antennas 110.

The internal space 51 of the OTA chamber 50 further accommodates a reflector 7 that realizes a radio wave path that returns a radio signal radiated from the antennas 110 of the DUT 100 to the receiving surface of the test antenna 6 and a heat-insulating housing 70 made of heat insulating material that surrounds a space region 71 including a quiet zone QZ. Further, a radio wave absorber 55 is attached to the entire inner surface of the OTA chamber 50, that is, the entire surfaces of a bottom surface 52a, a side surface 52b, and a top surface 52c of the housing body 52, thereby enhancing the function of restricting the emission of radio waves to the outside. In this way, the OTA chamber 50 realizes an anechoic chamber having the internal space 51 that is not affected by the surrounding radio wave environment. The anechoic chamber used in this embodiment is, for example, an anechoic type.

The DUT 100 to be tested is a wireless terminal such as a smartphone. The communication standards of the DUT 100 include cellular (LTE, LTE-A, W-CDMA (registered trademark), GSM (registered trademark), CDMA2000, 1×EV-DO, TD-SCDMA, and the like), wireless LAN (IEEE802.11b/g/a/n/ac/ad, and the like), Bluetooth (registered trademark), GNSS (GPS, Galileo, GLONASS, BeiDou, and the like), FM, and digital broadcasting (DVB-H, ISDB-T, and the like). Further, the DUT 100 may be a wireless terminal that transmits and receives millimeter wave band radio signals compatible with 5G cellular or the like.

In this embodiment, the DUT 100 is a 5G NR wireless terminal. For 5G NR wireless terminals, the 5G NR standard stipulates that, in addition to the millimeter wave band, predetermined frequency bands (see "5G NR band" in FIG. 8) including other frequency bands used in LTE and the like is set as a communicable frequency range. In short, the antennas 110 of the DUT 100 transmit or receive a radio signal in the predetermined frequency bands (5G NR bands) for measuring the transmission characteristics or the reception characteristics of the DUT 100. The antennas 110 are array antennas such as a Massive-MIMO antennas and correspond to the antenna under test in the present invention.

The 5G NR wireless terminal having the above-described communicable frequency range is set, for example, at the time of shipment so that it can communicate using any one of the bands identified by the numbers 1, 2, and 3 in the table shown in FIG. 8 and has a configuration in which the usable frequency band can be switched and set by a predetermined setting change operation thereafter. In such a wireless terminal, a baud set to be usable may be called an in-band, and a baud not set to be usable may be called an out-band. When the transmission characteristic measurement and the reception characteristic measurement are performed under the OTA environment in the OTA chamber 50 with the wireless terminal as the DUT 100, the measurement for ah the above-mentioned in-band and out-band is required.

FIG. 8 is a table showing the usable frequency band classification of the three test antennas 6 arranged in the OTA chamber 50 according to the present embodiment. As shown in FIG. 8, the three frequency bands identified by numbers 1, 2 and 3 are assigned to 3.3 GHz to 5.0 GHz, 24.25 GHz to 29.5 GHz, 40.5 GHz to 43.5 GHz, respectively. The frequency band of 3.3 GHz to 5.0 GHz assigned to the number 1 corresponds to a group of frequency bands (frequency band group) including, for example, the frequency bands of n77, n78, and n79 in the well-known 5G NR band list defined by 3GPP (3rd Generation Partnership Project). Similarly, the frequency bands of 24.25 GHz to 29.5 GHz and 40.5 GHz to 43.5 GHz assigned to the numbers 2 and 3 correspond to, for example, a group of frequency bands including the n258 and n257 frequency bands and a group of frequency band including the n259 frequency band defined in the band list.

In the present embodiment, in the internal space 51 of the OTA chamber 50, fee example, three test antennas 6 using the frequency bands corresponding to the numbers 1, 2, and 3 in the frequency band classification shown in FIG. 8 are arranged. The three test antennas 6 are automatically arranged one by one at the focal position of the reflector 7 (indicated by symbol F in FIG. 1) by an automatic antenna placement unit 60 shown in FIG. 1. Meanwhile, the DUT 100 according to the present embodiment has a configuration in which the frequency bands corresponding to the numbers 1, 2, and 3 can be selectively set as usable frequency bands. During the measurement related to transmission and reception in the OTA chamber 50, the DUT 100 can transmit and receive signals under measurement and test signals through the test antenna 6 sequentially arranged at the focal position F by using the frequency bands corresponding to the numbers 1, 2, and 3 in order.

Next, an arrangement mode of an orientation changing mechanism 56, the test antenna 6, the reflector 7, and the heat-insulating housing 70 in the internal space 51 of the OTA chamber 50 will be described. As shown in FIG. 1, in the OTA chamber 50, the orientation changing mechanism 56 that sequentially changes the orientation of the DUT 100 placed in the quiet zone QZ is provided on the bottom surface 52a of the housing body 52 in the internal space 51. The orientation changing mechanism 56 is, for example, a 2-axis positioner including a rotating mechanism that rotates in biaxial directions and constitutes an OTA test system (combined-axes system) that rotates the DUT 100 with two degrees of freedom while the test antenna 6 is fixed. Specifically, the orientation changing mechanism 56 includes a drive unit 56a, a turntable 56b, a support column 56c, and a DUT mounting part 56d.

The drive unit 56a includes a drive motor such as a stepping motor that generates a rotational driving force, and is installed on the bottom surface 52a, for example. The turntable 56b is configured to rotate by a predetermined angle around one of two axes orthogonal to each other by the rotational driving force of the drive unit 56a. The support column 56c is connected to the turntable 56b, extends from the turntable 56b in the direction of the one axis, and is rotated together with the turntable 56b by the rotational driving force of the drive unit 56a. The DUT mounting part 56d extends from the side surface of the support column 56c in the direction of the other of the two axes and is rotated about the other axis by a predetermined angle by the rotational driving force of the drive unit 56a. The DUT 100 is placed on the DUT mounting part 56d.

The above-mentioned one axis is, for example, an axis (x axis in the figure) extending in the vertical direction with respect to the bottom surface 52a. The other axis is, for example, an axis extending in the horizontal direction from the side surface of the support column 56c. The orientation changing mechanism 56 configured in this manner rotates the DUT 100 held by the DUT mounting part 56d, for example, with the center of the DUT 100 as the center of rotation, so that the orientation of the DUT 100 can be sequentially changed so that the antennas 110 feces in all three-dimensional directions. That is, the temperature test apparatus 1 of the present embodiment can perform tests by the "Black-box approach" by the orientation changing mechanism 56 as described above.

In the OTA chamber 50, two types of link antennas 5 and 8 fear establishing or holding a link (call) with the DUT 100 are provided at required positions of the housing body 52 by using holders 57 and 59, respectively. The link antenna 5 is an LTE link antenna and is used in anon-standalone mode. Meanwhile, the link antenna 8 is a 5G link antenna and is used to keep a 5G-signal link. The link antennas 5 and 8 are respectively held by holders 57 and 59 to have directivity with respect to the DUT 100 held by the orientation changing mechanism 56. Note that, instead of using the above-mentioned link antennas 5 and 8, the test antenna 6 can also be used as a link antenna. Therefore, in the following description, it is assumed that the test antenna 6 also has the function of a link antenna.

Further, in the OTA chandler 50, an antenna holding mechanism 61 is provided below the bottom surface 52a of the housing body 52, and the antenna holding mechanism 61 holds a plurality of test antennas 6 in a state of being separated from each other. In the present embodiment, the antenna holding mechanism 61 holds, for example, three test antennas 6 capable of transmitting and receiving radio signals of three measurement target frequency bands identified by numbers 1 to 3 in the table shown in FIG. 8.

The antenna holding mechanism 61 is attached to the bottom surface 52a in the internal space 51 of the OTA chamber 50 via a power unit 64. The antenna holding mechanism 61 constitutes the automatic antenna placement unit 60 together with the power unit 64 and the automatic antenna placement control unit 16 (see FIG. 2).

The automatic antenna placement unit 60 mounted in the OTA chamber 50 has, for example, as shown in FIGS. 1 and 2, the antenna holding mechanism 61, the power unit 64, a cover part 67, and the automatic antenna placement control unit 16. The antenna holding mechanism 61 is composed of a rotating body 62 rotatable about a rotating shaft 63, and in the rotating body 62, for example, three test antennas 6 are arranged on a circumference around the rotating shaft 63.

The power unit 64 has a drive motor 65 that rotationally drives the rotating body 62 via the rotating shaft 63, and a connecting member 66 such as a gear arranged between the drive motor 65 and the rotating shaft 63. The cover part 67 covers the antenna holding mechanism 61 and the power unit 64 so that the intrusion of radio waves from the outside and the emission of the radio waves to the outside can be regulated.

An opening 67a is formed in the cover part 67. The opening 67a is formed at a position where it is possible to secure a see-through from one of the test antennas 6 held by the antenna holding mechanism 61 to the paraboloid of revolution of the reflector 7, when the antenna 6 is arranged at the focal position F of the reflector 7.

The automatic antenna placement control unit 16, for example, is based on a command from a control unit 11 (see FIG. 3) of the integrated control device 10, drives the drive motor 65 so that each test antenna 6 sequentially moves to the focal position F of the reflector 7 and is stopped, in accordance with each measurement target frequency band identified by the numbers 1 to 3 in the table shown in FIG. 8.

In the OTA chandler 50, the reflector 7 has an offset parabola (see FIG. 7) type structure described later. As shown in FIG. 1, the reflector 7 is attached to a required position on the side surface 52b of the OTA chamber 50 using a reflector holder 58. The reflector 7 is arranged in such a position and orientation that the test signal radiated from one test antenna 6 arranged at the focal position F determined from the paraboloid of revolution can be received by the paraboloid of revolution and reflected toward the DUT 100 held by the orientation changing mechanism 56. The reflector 7 thus arranged also receives a signal under measurement radiated from the antennas 110 by the DUT 100 receiving the test signal on the paraboloid of revolution and reflects it toward the test antenna 6 that radiated the test signal. That is, the reflector 7 reflects the radio waves of the radio signals transmitted and received between the test antenna 6 and the antennas 110 via the paraboloid of revolution. In the present embodiment, as the test antennas 6 for transmitting and receiving the test signal and the signal under measurement, the three test antennas 6 held by the antenna holding mechanism 61 are automatically arranged one by one at the focal position F by the automatic antenna placement unit 60 in order.

Figure 5A:
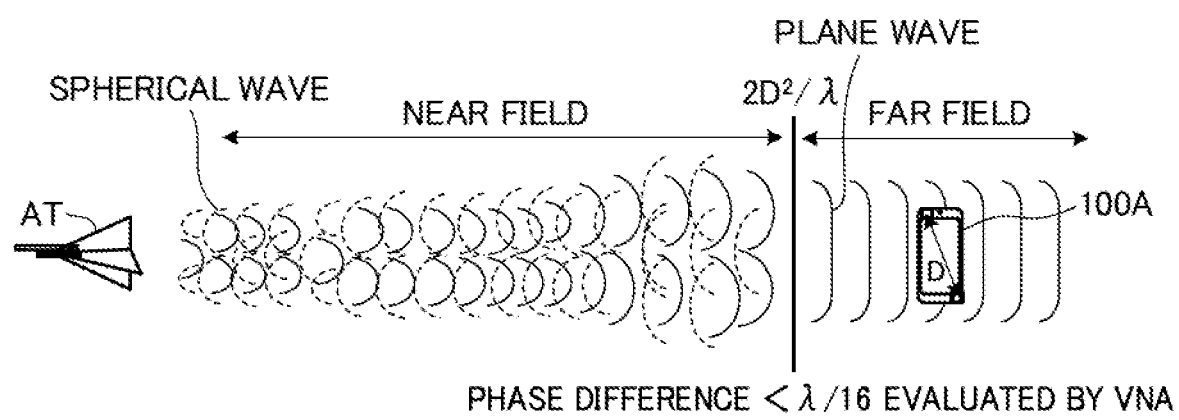
FIG. 5A is a schematic diagram for explaining a near field and a far field in radio wave propagation between the antenna AT and the wireless terminal, and shows an example of the direct far field.
Figure 5B:
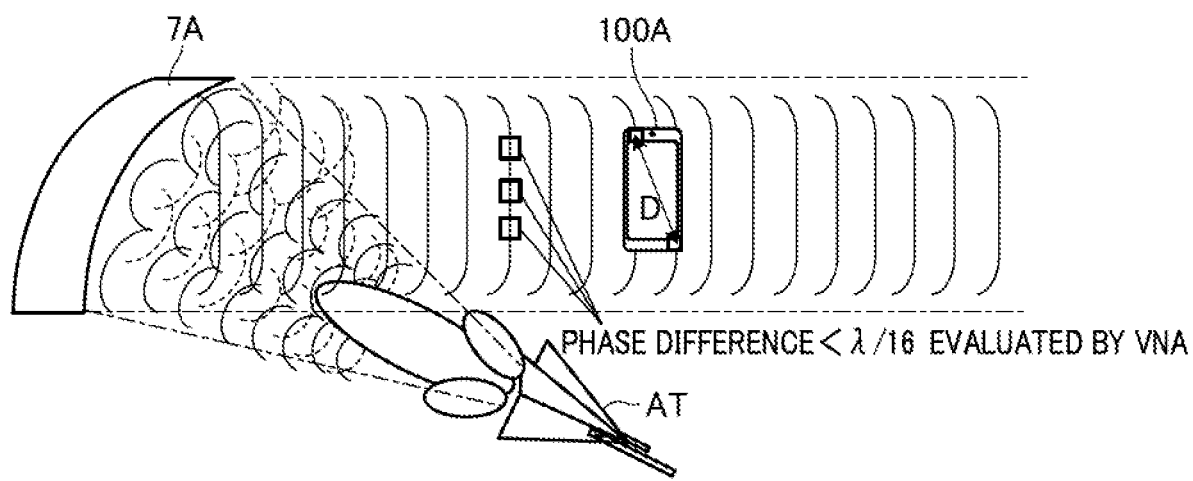
FIG. 5B is a schematic diagram for explaining a near field and a far field in radio wave propagation between the antenna AT and the wireless terminal, and shows an example of CATR.

Here, the merits of mounting the reflector 7 in the OTA chamber 50 and the preferable form of the reflector 7 will be described with reference to FIGS. 5A, 5B, 6 and 7. FIGS. 5A and 5B are schematic diagrams showing how radio waves radiated from an antenna AT equivalent to the test antenna 6 propagate to a wireless terminal 100A, for example. The wireless terminal 100A is the same as the DUT 100. FIG. 5A shows an example of a case where radio waves are directly transmitted from the antenna AT to the wireless terminal 100A (Direct Far Field), and FIG. 5B shows an example of a case where radio waves are transmitted from the antenna AT to the wireless terminal 100A via a reflecting mirror 7A having a surface shaped as paraboloid of revolution (CATR).

As shown in FIG. 5A, radio waves whose radiation source is the antenna AT has a property of propagating while a surface (wavefront) connecting points of the same phase spreads in a spherical shape centering on the radiation source. At this time, interference waves caused by disturbances such as scattering, refraction, and reflection, which are indicated by broken lines, are also generated. Further, at a short distance from the radiation source, the wavefront is a curved spherical surface (spherical wave), bid at a long distance from the radiation source, the wavefront becomes close to a plane (plane wave). In general, the area where the wavefront must be considered as a sphere is called the near field (NEAR FIELD), and the area where the wavefront can be considered as a plane is called the far field (FAR FIELD). In the propagation of the radio waves shown in FIG. 5A, it is preferable that the wireless terminal 100A receive plane waves rather than spherical waves for accurate measurement.

In order to receive the plane wave, the wireless terminal 100A needs to be installed in the far field. Here, when the maximum linear size of the wireless terminal 100A is D and the wavelength of the radio wave is $\lambda$, the far field is a distance of $2D^2/\lambda$ or more from the antenna AT. Specifically, when D=0.4 m (meter) and wavelength $\lambda$=0.01 m (corresponding to a radio signal in the 28 GHz band), the position approximately 30 m from the antenna AT is the boundary between the near field and the far field. Therefore, it becomes necessary to place the wireless terminal 100A at a position farther than that. In the present embodiment, it is assumed that DUT 100 has the maximum linear size D of, for example, about 5 cm (centimeter) to 33 cm.

As described above, the direct far-field method shown in FIG. 5A has the characteristics that the propagation distance between the antenna AT and the wireless terminal 100A is large and the propagation loss is large. Therefore, as a coping method therefor, for example, as shown in FIG. 5B, there is a method of arranging the reflecting mirror 7A having a surface shaped as paraboloid of revolution so that the radio waves from the antenna AT are reflected and the reflected waves reach the position of the wireless terminal 100A. According to this method, not only the distance between the antenna AT and the wireless terminal 100A can be shortened, but also the area of the plane waves expands just from the mirror surface of the reflecting mirror 7A where the radio waves are reflected, so that a propagation loss reducing effect can also be expected. The degree of plane wave can be represented by the phase difference between waves having the same phase. The allowable phase difference as the degree of plane wave is, for example, $\lambda/16$. The phase difference can be evaluated by, for example, a vector network analyzer (VNA).

Figure 6:
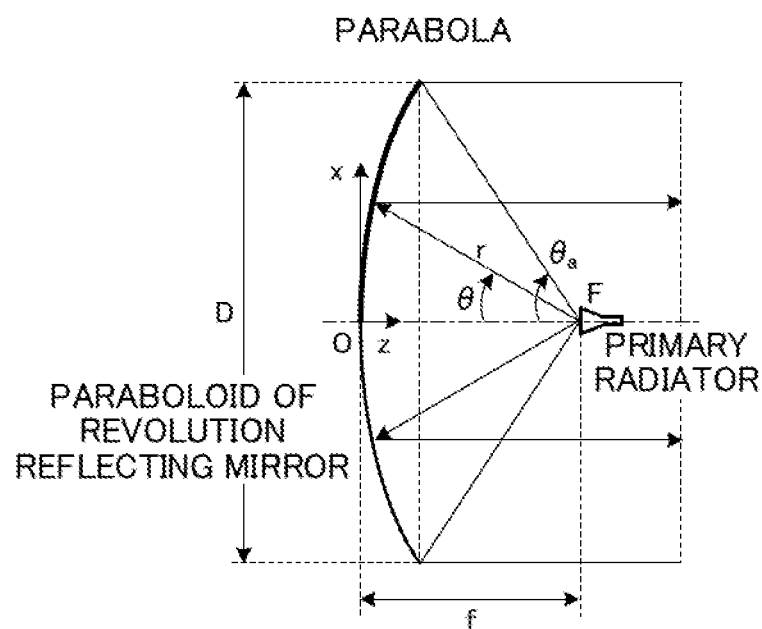
FIG. 6 is a schematic diagram showing a signal path structure of a parabola having a surface shaped as paraboloid of revolution similar to the reflector used in the OTA chamber of the temperature test apparatus according to the embodiment of the present invention.

The parabola (see FIG. 6) or the offset parabola (see FIG. 7) can be used as the reflecting mirror 7A shown in FIG. 5B. As shown in FIG. 6, the parabola has a mirror surface (paraboloid of revolution) symmetrical with respect to an axis passing through the antenna center O. The parabola has a function of reflecting radio waves emitted from a primary radiator in a direction parallel to the axial direction by installing the primary radiator having directivity in the direction of the paraboloid of revolution at a focal position F determined from the paraboloid of revolution. On the contrary, the parabola can reflect radio waves incident on the paraboloid of revolution in the direction parallel to the axial direction (for example, a radio signal transmitted by the DUT 100) and guide them to a test antenna 6 by disposing the test antenna 6 according to the present embodiment at the focal position F, for example. However, the parabola has a perfect circular planar shape when viewed from the front (z direction) and has a large structure, so that it is not suitable to be arranged as the reflector 7 of the OTA chamber 50.

Figure 7:
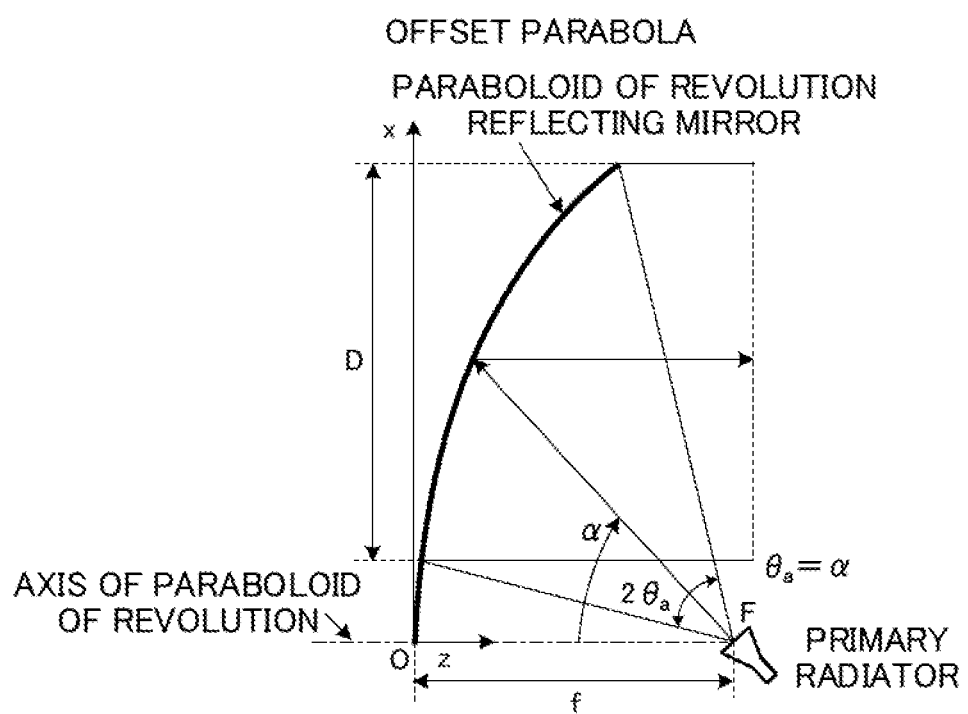
FIG. 7 is a schematic diagram showing a signal path structure of au offset parabola having a surface shaped as paraboloid of revolution similar to the reflector used in the OTA chamber of the temperature test apparatus according to the embodiment of the present invention.

On the other hand, as shown in FIG. 7, the offset parabola has a mirror surface (a shape obtained by cutting out a part of a paraboloid of revolution of a perfect circular parabola (see FIG. 6)) that is asymmetric with respect to the axis of the paraboloid of revolution. The offset parabola has a function of reflecting radio waves emitted from the primary radiator in a direction parallel to the axial direction of the paraboloid of revolution by installing the primary radiator with its beam axis inclined, for example, at an angle α with respect to the axis of the paraboloid of revolution. This offset parabola can reflect radio waves radiated from the test antenna 6 (for example, a test signal for the DUT 100) on the paraboloid of revolution in a direction parallel to the axial direction of the paraboloid of revolution by disposing the test antenna 6 according to the present embodiment at the focal position F, for example. This offset parabola can also reflect radio waves incident on the paraboloid of revolution in a direction parallel to the axial direction of the paraboloid of revolution (for example, a signal under measurement transmitted frail the DUT 100) on the paraboloid of revolution and guide them to the test antenna 6. The offset parabola can be arranged so that the mirror surface is close to vertical, and the structure is significantly smaller than that of the parabola (see FIG. 6).

Based on the above-mentioned findings, in the OTA chamber 50 according to the present embodiment, as shown in FIG. 1, the reflector 7 using the offset parabola (see FIG. 7) is arranged in the radio wave propagation path between the DUT 100 and the test antenna 6. The reflector 7 is attached to the side surface 52b of the housing body 52 so that the position indicated by symbol F in the drawing is the focal position.

The reflector 7 and one of the three test antennas 6 held by the antenna holding mechanism 61 (located at the focal position) are in an offset state in which the beam axis BS1 of the test antenna 6 is inclined by a predetermined angle α with respect to the axis RSI of the reflector 7. The one test antenna 6 referred to here is the test antenna 6 capable of ensuring see-through from the reflector 7 through the opening 67a of the cover part 67 that covers the antenna holding mechanism 61.

The reflector 7 has the focal position F on the beam axis BS1 of the test antenna 6, and each test antenna 6 held by the rotating body 62 of the antenna holding mechanism 61 can sequentially pass through the position of one test antenna 6 capable of ensuring the above-mentioned see-through, that is, the focal position F of the reflector 7. The tilt angle α described above can be set to 30 degrees, for example. In this case, the test antenna 6 faces the reflector 7 at an elevation angle of 30 degrees and is held by the antenna holding mechanism 61 at an angle at which the receiving surface of the test antenna 6 is perpendicular to the beam axis of the radio signal. The use of the offset parabolic reflector 7 allows the reflector 7 itself to be small and allows the reflector 7 to be arranged so that the mirror surface approaches the vertical direction, which has the advantage of reducing the structure of the OTA chamber 50.

Figure 9:
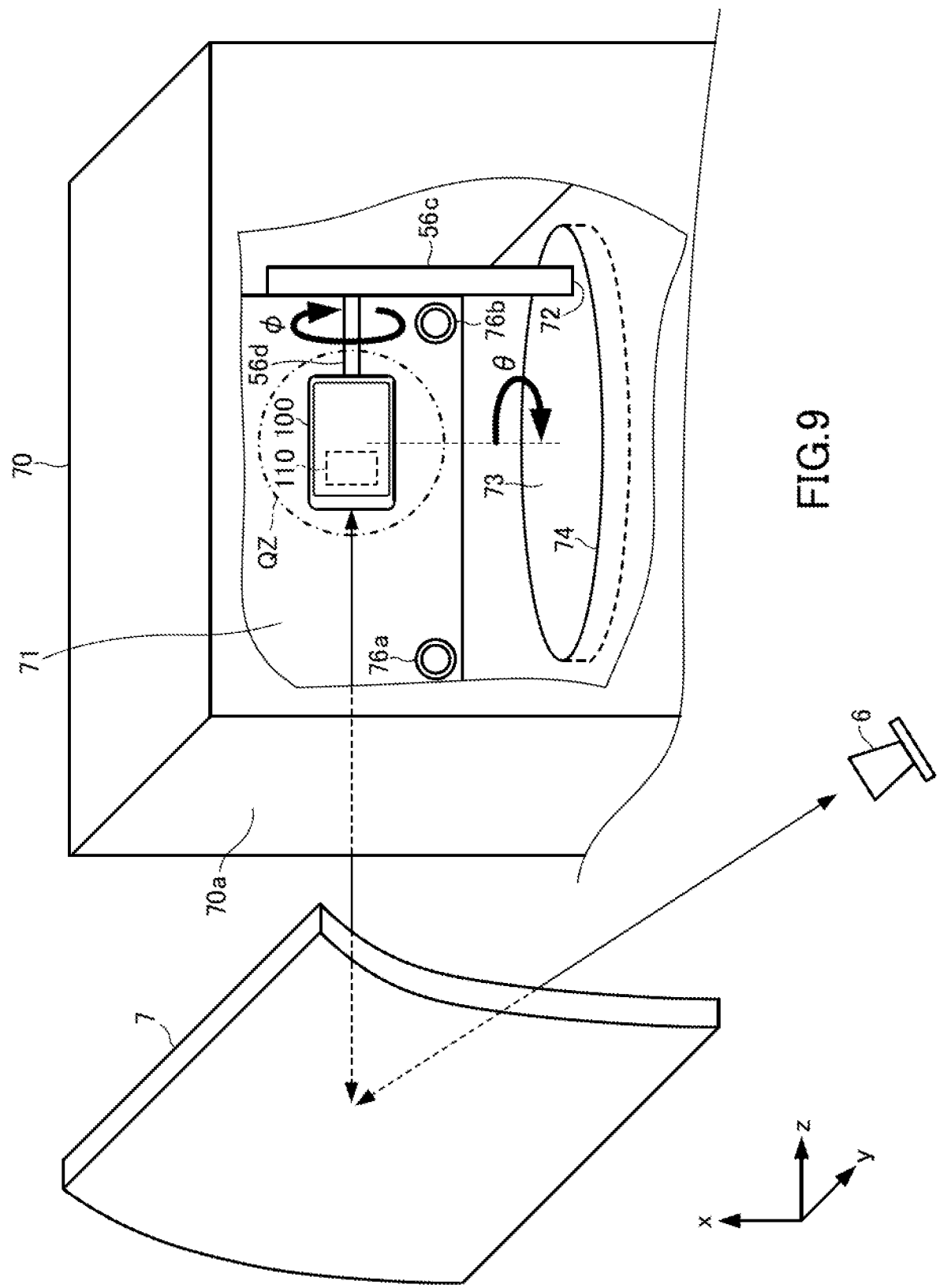
FIG. 9 is a perspective view which shows schematic structure of the heat-insulating housing in the temperature test apparatus according to the embodiment of the present invention.
Figure 10:
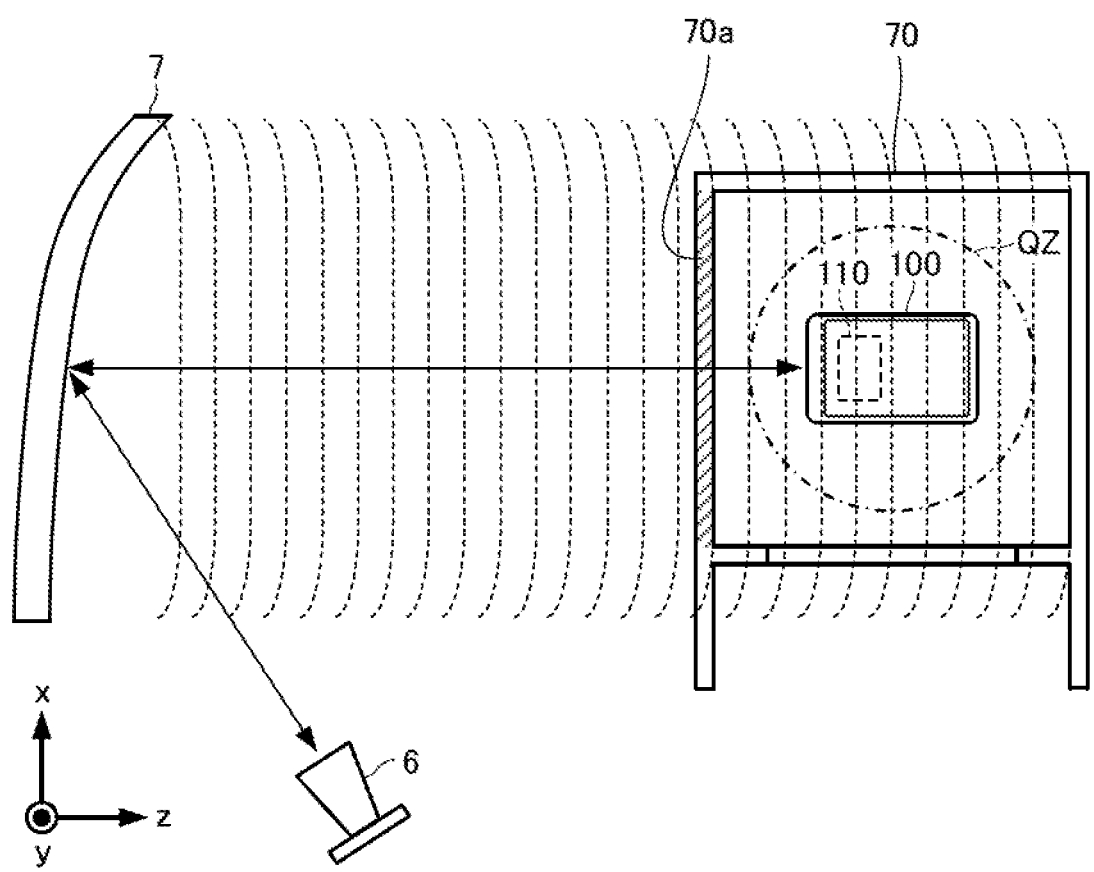
FIG. 10 is a schematic diagram showing the arrangement of the flat plate shaped part of the heat-insulating housing in the temperature test apparatus according to the embodiment of the present invention.

Next, a preferable form of the heat-insulating housing 70 housed in the internal space 51 will be described. As shown in FIGS. 1 and 9, the heat-insulating housing 70 is made of heat insulating material and surrounds and seals the space region 71 including at least the quiet zone QZ. In the space region 71, the DUT 100, the DUT mounting part 56d, and a part of the support column 56c are accommodated. As shown in FIG. 10, in the area of the heat-insulating housing 70 through which the radio waves of the radio signal transmitted from the test antenna 6 passes before entering the quiet zone QZ, a flat plate shaped part 70a is formed which is perpendicular to the traveling direction of the radio waves of the radio signal incident on the quiet zone QZ and has a uniform thickness. In FIG. 10, the broken line represents the wavefront of the radio waves of the test signal. It is desirable that the flat plate shaped part 70a be provided within the entire area of the heat-insulating housing 70 through which the radio waves of the test signal that can be regarded as plane waves transmitted from the test antenna 6 passes before entering the quiet zone QZ.

The heat insulating material forming the heat-insulating housing 70 is preferably a material having a dielectric constant close to that of air and a small dielectric loss. As the heat insulating material, for example, a foam such as expanded polystyrene (EPS), polymethacrylimide hard foam, or polytetrafluoroethylene (pTFE) can be used.

Further, in order to make the orientation changing mechanism 56 equipped with the DUT 100 rotatable while the heat-insulating housing 70 is installed in the internal space 51, the heat-insulating casing 70 is configured as shown in FIGS. 1 and 9. That is, the heat-insulating casing 70 includes a disk-shaped rotating part 73 that has a through hole 72 through which a part of the support column 56c penetrates and that rotates together with the turntable 56b and the support column 56c, and a hole part 74 that has an inner diameter substantially equal to the outer diameter of the rotating part 73 and that accommodates the rotating part 73 in a slidably rotatable manner. For example, by cutting a part of a heat-insulating housing made of heat insulating material into a disk shape, the rotating part 73 and the hole part 74 having an inner diameter substantially equal to the outer diameter of the rotating part 73 can be easily formed.

Figure 11:
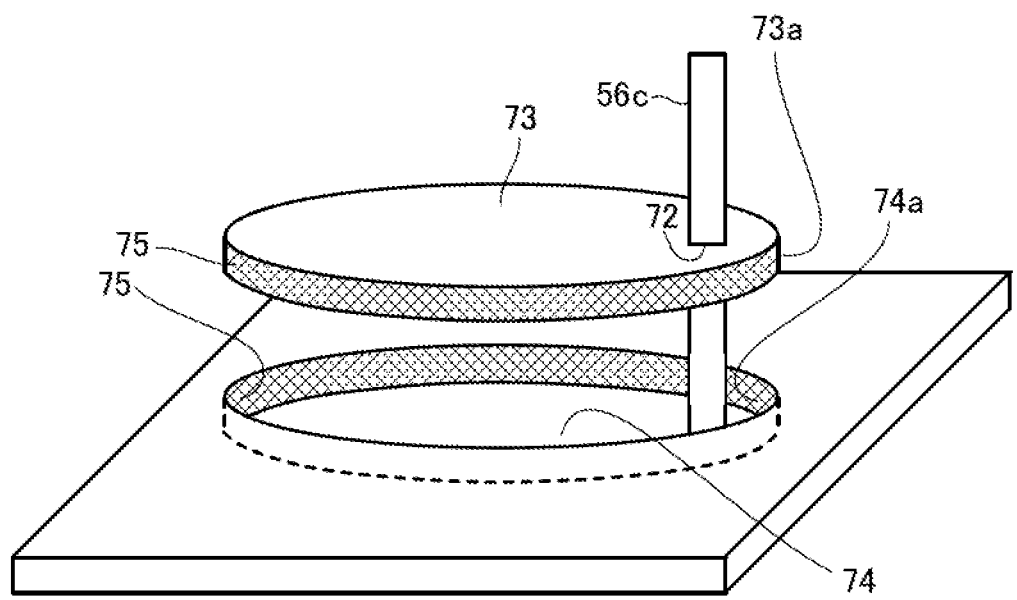
FIG. 11 is a schematic view showing the arrangement of the friction reducing parts provided in the heat-insulating housing in the temperature test apparatus according to the embodiment of the present invention.

In the temperature test apparatus 1 of the present embodiment, it is important to rotate the orientation changing mechanism 56 equipped with the DUT 100 while preventing the air in the space region 71 inside the heat-insulating housing 70 from leaking to the outside as much as possible. At this time, there is a problem in that the durability of the heat-insulating housing 70 made of a heat insulating material deteriorates due to friction between the rotating part 73 that rotates together with the orientation changing mechanism 56 and the hole part 74. In order to solve this problem, as shown in FIG. 11, it is desirable to provide friction reducing parts 75, for reducing the friction between a side wall surface 73a of the rotating part 73 and an inner wall surface 74a of the hole part 74, on the side wall surface 73a that faces the hole part 74 and on the inner wall surface 74a that faces the rotating part 73.

The friction reducing parts 75 is preferably made of a material having a small coefficient of friction and high self-lubricating property. As the friction reducing parts 75, for example, a film or sheet made of polyacetal (POM), PTFE, ultra-high molecular weight polyethylene (UHPE), or the like can be used.

Figure 12:
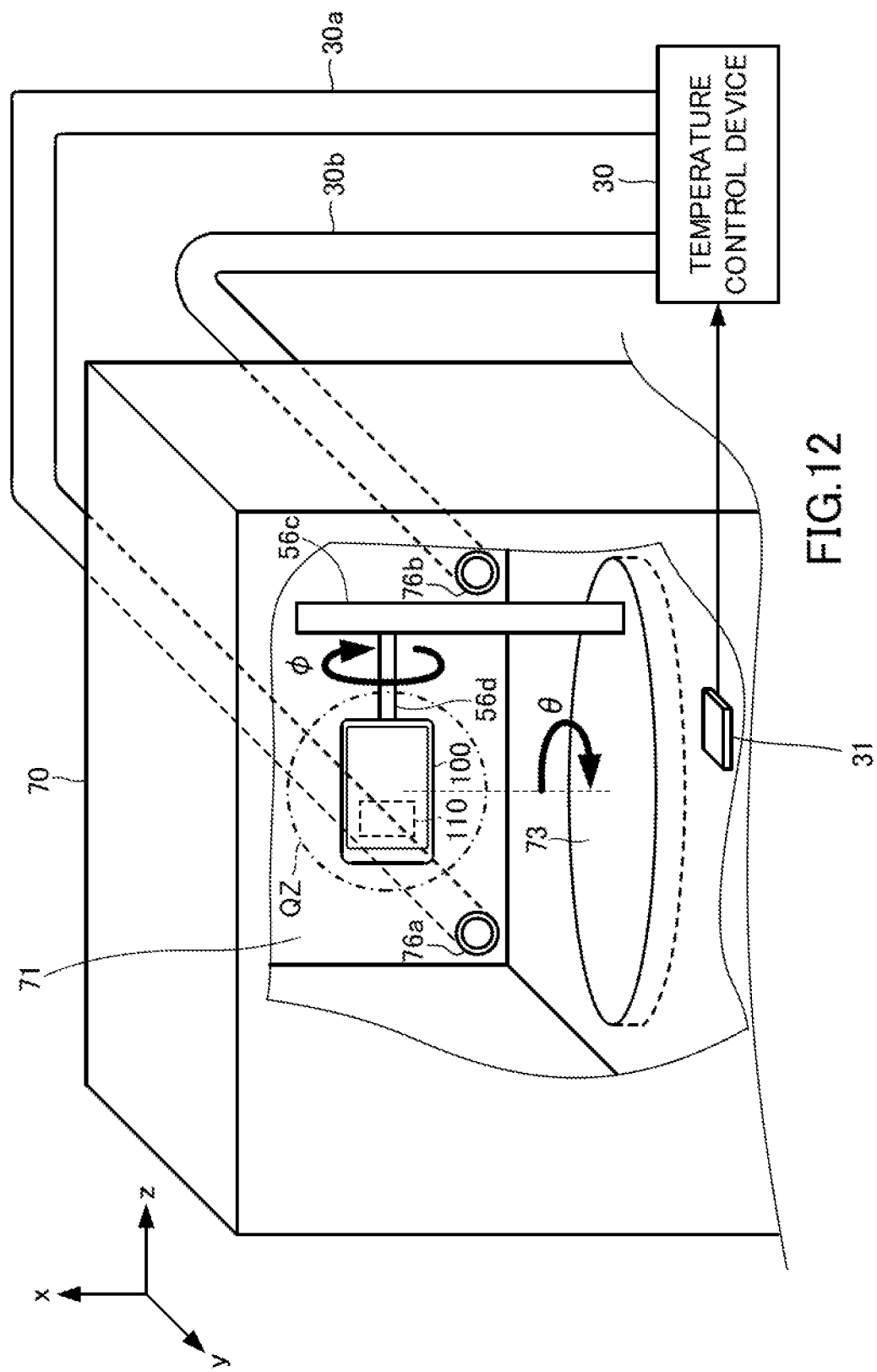
FIG. 12 is a schematic diagram for explaining the temperature control inside the heat-insulating housing by the temperature test apparatus according to the embodiment of the present invention.

Next, a configuration for controlling the temperature of the air in the space region 71 surrounded by the heat-insulating housing 70 will be described. As shown in FIG. 12, the temperature test apparatus 1 includes the temperature control device 30 capable of controlling the temperature of the air in the space region 71 of the heat-insulating housing 70 to any one of a plurality of predetermined temperatures. In addition, a temperature sensor 31 for monitoring the temperature of the air in the space region 71 is provided inside the heat-insulating housing 70. The temperature sensor 31 is connected to the temperature centred device 30.

Pipes 30a and 30b are connected to the heat-insulating housing 70. The pipe 30a is adapted to allow heated or coded air generated by the temperature control device 30 to flow into the heat-insulating housing 70 through an opening 76a provided in the heat-insulating housing 70. Meanwhile, the pipe 30b is configured to discharge the air pushed out from the inside of the heat-insulating housing 70 with the inflow of air from the pipe 30a to the outside of the heat-insulating housing 70 through an opening 76b. The temperature control device 30 generates the heated or cooled air so that the temperature instruction value of the temperature sensor 31 matches the temperature set value input by the user operating an operation unit 12 (see FIG. 3), for example. In this way, the temperature control device 30 can adjust the temperature of the air in the space region 71 to an arbitrary temperature in the range of –30° C. to 70° C., for example.

Figure 4:
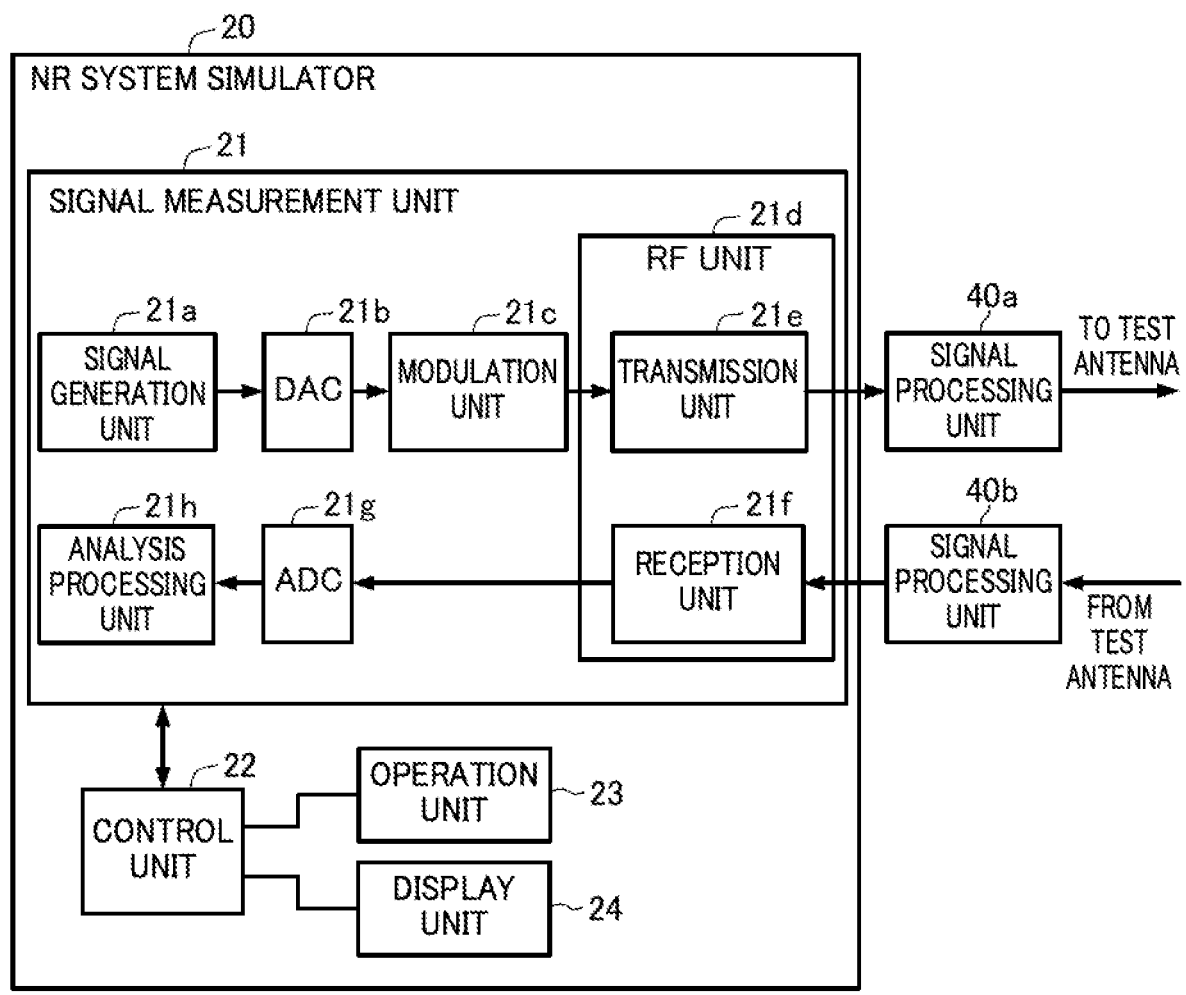
FIG. 4 is a block diagram showing a functional configuration of the NR system simulator in the temperature test apparatus according to the embodiment of the present invention.

Here, the functional configuration of the temperature test apparatus 1 according to the present embodiment will be described in more detail with reference to FIGS. 2 to 4. In the temperature test apparatus 1 (see FIG. 2) according to the present embodiment, the integrated control device 10 has a functional configuration as shown in FIG. 3, and the NR system simulator 20 has a functional configuration as shown in FIG. 4, for example. The NR system simulator 20 measures the transmission characteristics or the reception characteristics of the DUT 100 every time the orientation of the DUT 100 is changed by the orientation flumping mechanism 56 while the temperature of the space region 71 is controlled by the temperature control device 30. The NR system simulator 20 constitutes the measuring device of the invention.

As shown in FIG. 3, the integrated control device 10 includes a control unit 11, an operation unit 12, and a display unit 13. The control unit 11 is composed of for example, a computer device. For example, as shown in FIG. 3, this computer device includes a CPU (Central Processing Unit) 11a that performs predetermined information processing for realizing the functions of the temperature test apparatus 1 and performs overall control of the NR system simulator 20, a ROM (Read Only Memory) 11b that stores an OS (Operating System) for booting the CPU 11a, other programs, control parameters, and the like, a RAM (Random Access Memory) 11c for storing execution codes and data of the OS and applications used by the CPU 11a, an external interface (I/F) unit 11d having an input interface function for receiving predetermined signals and an output interface function for outputting predetermined signals, a non-volatile storage medium such as hard disk device (not shown), and various input/output ports. The external I/F unit 11d is communicably connected to the NR system simulator 20 via the network 19. The external I/F unit 11d is also connected to the drive motor 65, the temperature control device 30, and the orientation changing mechanism 56 in the OTA chamber 50 via the network 19. The operation unit 12 and the display unit 13 are connected to the input/output ports. The operation unit 12 is a functional unit for inputting various kinds of information such as commands. The display unit 13 is a functional unit for displaying various kinds of information such as an input screen for the various kinds of information and measurement results.

The computer device described above functions as the centred unit 11 by the CPU 11a executing a program stored in the ROM 11b using the RAM 11c as a work area. As shown in FIG. 3, the control unit 11 includes a call connection control unit 14, a signal transmission/reception control unit 15, an automatic antenna placement control unit 16, a DUT orientation control unit 17, and a temperature centred unit 18. The call connection control unit 14, the signal transmission/reception control unit 15, the automatic antenna placement control unit 16, the DUT orientation control unit 17, and the temperature control unit 18 are also realized by the CPU 11a executing a predetermined program stored in the ROM 11b in the work area of the RAM 11c.

The call connection control unit 14 drives the test antenna 6 automatically arranged at the focal position F of the reflector 7 to transmit/receive a control signal (a radio signal) to/from the DUT 100, thereby controlling to establish a call (a state in which radio signals can be transmitted and received) between the NR system simulator 20 and the DUT 100.

The signal transmission/reception control unit 15 monitors a user operation on the operation unit 12. The signal transmission/reception control unit 15 transmits a signal transmission command to the NR system simulator 20 after the temperature control by the temperature control unit 18 and the call connection control by the call connection control unit 14 described later are performed when a user performs a predetermined measurement start operation for measuring the transmission characteristics and the reception characteristics of the DUT 100. Further, the signal transmission/reception control unit 15 controls to transmit a test signal via the test antenna 6, and controls to receive a signal under measurement via the test antenna 6 by transmitting a signal reception command.

The automatic antenna placement control unit 16 automatically and sequentially controls the placement of the plurality of test antennas 6 held by the antenna holding mechanism 61 of the automatic antenna placement unit 60 at the focal position F of the reflector 7. In order to realize this control, an automatic antenna placement control table 16a is stored in advance in the ROM 11b, for example. For example, when a stepping motor is used as the drive motor 65, the automatic antenna placement control table 16a stores the number of driving pulses (the number of operation pulses) that determines the rotational driving of the stepping motor as control data. In the present embodiment, the automatic antenna placement control table 16a stores the number of operation pulses of the drive motor 65 as the control data for moving each test antenna 6 to the focal position F of the reflector 7. Here, each test antenna 6 corresponds to three measurement target frequency bands identified by, for example, numbers 1 to 3 shown in FIG. 8.

The automatic antenna placement control unit 16 expands the automatic antenna placement control table 16a in the work area of the RAM 11c. The automatic antenna placement control unit 16 controls the drive motor 65 in the power unit 64 of the automatic antenna placement unit 60 to rotate according to the measurement target frequency band corresponding to each test antenna 6 based on the automatic antenna placement control table 16a. With this control, it is possible to realize automatic antenna placement control in which the test antennas 6 are sequentially stopped (placed) at the focal position F of the reflector 7. In this embodiment, an example is given in which the automatic antenna placement control unit 16 rotationally drives the drive motor 65 so that the test antennas 6 rotate in one direction (see FIG. 1), but the present invention is not limited to this. Instead, the automatic antenna placement control unit 16 may be configured such that the drive motor 65 can be rotationally driven in the opposite direction or in both directions.

The DUT orientation control unit 17 controls the orientation of the DUT 100 held by the orientation changing mechanism 56 during measurement. In order to realize this control, for example, the ROM 11b stores a DUT orientation control table 17a in advance. For example, when a stepping motor is used as the drive unit 56a, the DUT orientation control table 17a stores the number of driving pulses (the number of operation pulses) tint determines the rotational driving of the stepping motor as control data.

The DUT orientation control unit 17 expands the DUT orientation control table 17a in the work area of the RAM 11c. Based on the DUT orientation control table 17a, the DUT orientation control unit 17 drives and controls the orientation changing mechanism 56 so that the DUT 100 changes its orientation so that the antennas 110 is sequentially oriented in all three-dimensional directions, as described above.

The temperature control unit 18 monitors a user operation on the operation unit 12 and transmits a temperature control command to the temperature control device 30 when the measurement start operation is performed by the user.

Further, in the temperature test apparatus 1 according to the present embodiment, the NR system simulator 20 has, for example, as shown in FIG. 4, a signal measurement unit 21, a control unit 22, an operation unit 23, and a display unit 24. The signal measurement unit 21 includes a signal generation function unit configured by a signal generation unit 21a, a digital-analog converter (DAC) 21b, a modulation unit 21c, and a transmission unit 21e of an RF unit 21d, and a signal analysis function unit configured by a reception unit 21f of the RF unit 21d, an analog-digital converter (ADC) 21g, and an analysis processing unit 21h.

In the signal generation function unit of the signal measurement unit 21, the signal generation unit 21a generates waveform data having a reference waveform, specifically, for example, an I-component baseband signal and a Q-component baseband signal which is an orthogonal component signal of the T-component baseband signal. The DAC 21b converts the waveform data (I-component baseband signal and Q-component baseband signal) having the reference waveform output from the signal generation unit 21a from a digital signal to an analog signal and outputs the analog signal to the modulation unit 21c. The modulation unit 21c performs a modulation process of mixing a local signal with each of the I-component baseband signal and the Q-component baseband signal and combining them to output a digital modulation signal. The RF unit 21d generates a test signal corresponding to the frequency of each communication standard from the digital modulation signal output from the modulation unit 21c, and outputs the generated test signal toward the DUT 100 by the transmission unit 21e.

Further, in the signal analysis function unit of the signal measurement unit 21, the RF unit 21d receives the signal under measurement transmitted from the DUT 100, which has received the test signal by the antennas 110, by the reception unit 21f via the signal processing unit 40b. Then, the RF unit 21d converts the signal under measurement into a signal in an intermediate frequency band (IF signal) by mixing with a local signal. The ADC 21g converts the signal under measurement which has been converted into an IF signal by the reception unit 21f of the RF unit 21d, from an analog signal into a digital signal and outputs the digital signal to the analysis processing unit 21h.

The analysis processing unit 21h digitally processes the signal under measurement, which is a digital signal output from the ADC 21g, to generate waveform data corresponding to an I-component baseband signal and a Q-component baseband signal, respectively. Then the analysis processing unit 21h performs a process of analyzing the I-component baseband signal and the Q-component baseband signal based on the waveform data. In the measurement of the transmission characteristics for the DUT 100, the analysis processing unit 21h can measure, for example, Equivalent Isotropically Radiated Power (EIRP), Total Radiated Power (TRF), spurious emission, modulation accuracy (EVM), transmit power, constellation, spectrum, and the like. Further, the analysis processing unit 21h can measure, for example, reception sensitivity, bit error rate (BER), packet error rate (PER), and the like in the measurement of the reception characteristics for the DUT 100. Here, EIRP is the radio signal strength in the main beam direction of an antenna under test. Meanwhile, TRP is the total value of the power radiated from the antenna under test into the space.

Like the control unit 11 of the integrated control device 10 described above, the control unit 22 is configured by, for example, a computer device including a CPU, a RAM, a ROM, and various input/output interfaces. The CPU performs predetermined information processing and control for realizing the functions of the signal generation function unit, the signal analysis function unit, the operation unit 23, and the display unit 24.

The operation unit 23 and the display unit 24 are connected to the input/output interfaces of the computer device. The operation unit 23 is a functional unit for inputting various lands of information such as commands, and the display unit 24 is a functional unit for displaying various kinds of information such as an input screen for the various kinds of information and measurement results.

Figure 13:
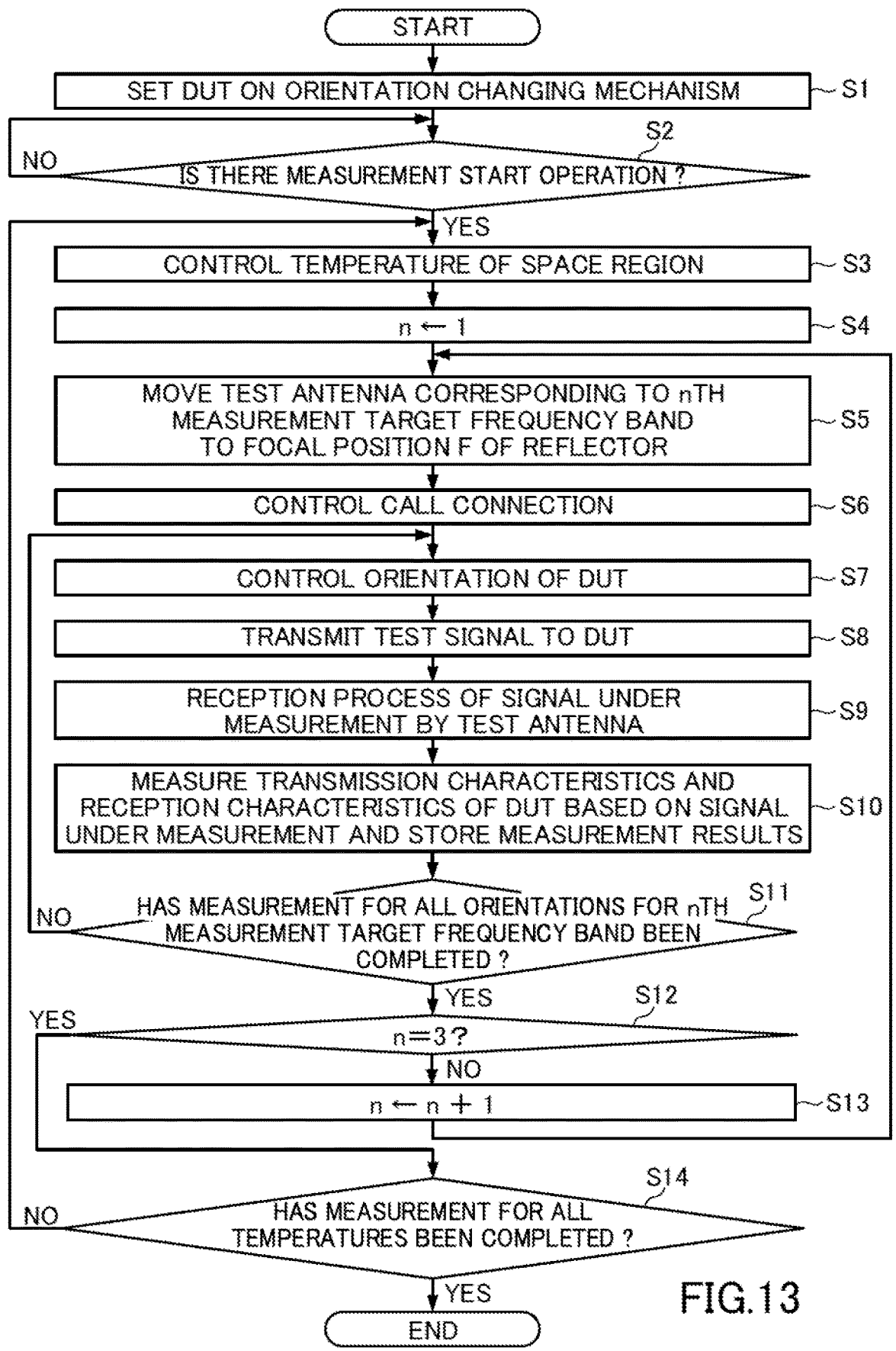
FIG. 13 is a flowchart showing the transmission characteristics and reception characteristics measurement processing of the DUT in the temperature test apparatus according to the embodiment of the present invention.

Next, the measurement processing of the transmission characteristics and the reception characteristics of the DUT 100 by the temperature test apparatus 1 according to the present embodiment will be described with reference to the flowchart of FIG. 13, in FIG. 13, it is assumed that the DUT 100 is measured while sequentially arranging three test antennas 6 capable of using the respective frequency bands among the 5G NR band (see FIG. 8) indicated by the numbers 1, 2, and 3 at the focal position F. In the following description, the frequency band indicated by number 1 will be called in-band 1, the frequency band indicated by number 2 will be called in-band 2, and the frequency band indicated by number 3 will be called in-band 3.

Further, in FIG. 13, a case will be described in which the measurement start operation for instructing to start the measurement processing of the transmission characteristics and the reception characteristics of the DUT 100 is performed by the operation unit 12 of the integrated control device 10. The measurement start operation may be performed by the operation unit 23 of the NR system simulator 20.

In order to measure the transmission characteristics and the reception characteristics of the DUT 100 by the temperature test apparatus 1, it is first necessary to set the DUT 100 in the internal space 51 of the OTA chamber 50. As a result, in the temperature test apparatus 1, as a first process, the user performs an operation of setting the DUT 100 to be tested on the DUT mounting part 56d of the orientation changing mechanism 56 in the OTA chamber 50 (step S1). In the automatic antenna placement unit 60, it is necessary for the antenna holding mechanism 61 to hold a plurality of (three in this example) test antennas 6 capable of covering the three measurement target frequency bands. Here, the antenna holding mechanism 61 needs to be installed at a position where each of the test antennas 6 can sequentially pass through the focal position F (see FIG. 7) of the reflector 7.

After the setting week of the DUT 100 is performed, in the integrated control device 10, for example, the control unit 11 monitors whether or not the operation unit 12 performs a measurement start operation of the transmission characteristics and the reception characteristics of the DUT 100 (step S2).

Here, when it is determined that the measurement start operation is not performed (NO in step S2), the control unit 11 continues the monitoring in step S2. Meanwhile, when it is determined that the measurement start operation is performed (YES in step S2), the temperature control unit 18 included in the control unit 11 transmits a temperature control command to the temperature control device 30. Based on the temperature control command, the temperature control device 30 controls to adjust the temperature of the air in the space region 71 to any one of a plurality of predetermined temperatures corresponding to a plurality of temperature set values input in advance by the user operating the operation unit 12 (temperature control step S3).

After the temperature of the space region 71 is controlled to the desired temperature set value by the temperature control device 30, the automatic antenna placement control unit 16 sets n indicating the measurement order of the measurement target frequency band to n=1 indicating the first measurement target frequency band (step S4). In this example, the maximum value of n is 3.

Next, the automatic antenna placement control unit 16 performs control to automatically move (place) the test antenna 6 corresponding to the nth measurement target frequency band to the focal position F of the reflector 7 (step S5). At this time, the automatic antenna placement control unit 16 reads the number of operation pulses of the test antenna 6 corresponding to the nth measurement target frequency band (in-band) from the automatic antenna placement control table 16a, and controls the rotation of the drive motor 65 based on the number of operation pulses.

When the automatic placement of the test antenna 6 corresponding to the nth measurement target frequency band at the focal position F of the reflector 7 is completed by the rotation control, the call connection control unit 14 of the control unit 11 performs call connection control by transmitting/receiving a control signal (radio signal) to/from the DUT 100 by using the test antenna 6 that has been automatically arranged (step S6). Here, the NR system simulator 20 wirelessly transmits a control signal (call connection request signal) having the frequency of the nth transmission/reception measurement target frequency band to the DUT 100 through the test antenna 6. Then, the NR system simulator 20 performs call connection control for receiving a control signal (call connection response signal) transmitted by the DUT 100 which has received the call connection request signal and sets the frequency for which the connection is requested. By this call connection centred, between the NR system simulator 20 and the DUT 100, a state in which a radio signal in the nth transmission/reception measurement target frequency band can be transmitted/received is established via the test antenna 6 automatically arranged at the focal position F of the reflector 7 and the reflector 7.

The process of receiving a radio signal transmitted from the NR system simulator 20 via the test antenna 6 and the reflector 7 is a downlink (DL) process, and conversely, the process of transmitting a radio signal to the NR system simulator 20 via the reflector 7 and the test antenna 6 is an uplink (UL) process. The test antenna 6 has a function of a link antenna and is used to perform a process of establishing a link (call) and a process of downlink (DL) and uplink (UL) after the link is established.

After the call connection is established in step S6, the DUT orientation control unit 17 of the integrated control device 10 controls the orientation of the DUT 100 placed in the quiet zone QZ to a predetermined orientation by the orientation changing mechanism 56 (orientation changing step S7).

After the orientation changing mechanism 56 controls the DUT 100 to have a predetermined orientation, the signal transmission/reception control unit 15 of the integrated control device 10 transmits a signal transmission command to the NR system simulator 20. Based on the signal transmission command, the NR system simulator 20 controls to transmit a test signal to the DUT 100 via the test antenna 6 that is automatically arranged at the focal position F of the reflector 7 (step S8).

The test signal transmission control by the NR system simulator 20 is performed as follows. In the NR system simulator 20 (see FIG. 4), the control unit 22 that receives the signal transmission command controls the signal generation function unit and causes the signal generation unit 21a to generate a signal for generating a test signal. After that, this signal is subjected to digital/analog conversion processing by the DAC 21b and further modulated by the modulation unit 21c. Then the RF unit 21d generates a test signal corresponding to the frequency of each communication standard from the digital modulation signal, and the transmission unit 21e outputs the test signal (DL data) toward the DUT 100 via the test antenna 6. The signal processing unit 40a is provided between the transmission unit 21e and the test antenna 6, and the signal processing unit 40a includes an up converter, an amplifier, a frequency filter, and the like. The signal processing unit 40a performs frequency conversion (up conversion), amplification, and frequency selection processing on the test signal output to the test antenna 6. It should be noted that the signal transmission-reception control unit 15 controls to transmit the test signal at an appropriate timing after starting the control of the test signal transmission in step S8, until the measurement of the transmission characteristics and the reception characteristics of the DUT 100 in the frequency band corresponding to the test antenna 6 is completed.

Meanwhile, the DUT 100 operates to receive the test signal (DL data) sent through the test antenna 6 and the reflector 7 by the antennas 110 in different orientations that sequentially change based on the orientation control in step S7. Then, the DUT 100 operates to transmit a signal under measurement which is a response signal to the test signal.

After starting the transmission of the test signal in step S8, subsequently, the signal transmission/reception control unit 15 performs a process of causing the test antenna 6 that is automatically arranged at the focal position F of the reflector 7 to receive the signal under measurement transmitted from the DUT 100 that received the test signal and reflected by the reflector 7 (step S9).

In this reception process, the signal under measurement received via the test antenna 6 is input to the signal processing unit 40b. The signal processing unit 40b includes a down converter, an amplifier, a frequency filter, and the like. The signal processing unit 40b subjects the signal under measurement input from the test antenna 6 to frequency conversion (down conversion), amplification, and frequency selection processing.

Subsequently, the NR system simulator 20 executes a process of measuring the signal under measurement whose frequency is converted by the signal processing unit 40b (measurement step S10). In this measurement process, the signal under measurement signal-processed by the signal processing unit 40b is input to the reception unit 21f of the RF unit 21d in the NR system simulator 20 (see FIG. 4).

In the NR system simulator 20, the control unit 22 controls the signal analysis function unit to first convert the signal under measurement input to the reception unit 21f of the RF unit 21d into an IF signal having a lower frequency. Next, the control unit 22 controls the ADC 21g to convert the IF signal from an analog signal into a digital signal and to input the converted IF signal into the analysis processing unit 21h, and controls the analysis processing unit 21h to generate waveform data corresponding to the I-component baseband signal and the Q-component baseband signal, respectively. Further, the control unit 22 controls the analysis processing unit 21h to analyze the signal under measurement based on the above-mentioned generated waveform data.

In the NR system simulator 20, the control unit 22 performs control for measuring the transmission characteristics and the reception characteristics of the DUT 100 based on the analysis result of the signal under measurement by the analysis processing unit 21h. For example, regarding the transmission characteristics of the DUT 100, the control unit 22 causes the NR system simulator 20 to transmit a request frame for uplink signal transmission as a test signal. Then, the control unit 22 performs a process of evaluating the transmission characteristics of the DUT 100 based on the uplink signal frame transmitted by the DUT 100 as the signal under measurement in response to the request frame for the uplink signal transmission. Regarding the reception characteristics of the DUT 100, the control unit 22 determines the error rate (PER) which is calculated as the ratio of the number of transmissions of the measurement frame transmitted as the test signal from the NR system simulator 20 and the number of receptions of the ACK and NACK transmitted from the DUT 100 as the signal under measurement in response to the measurement frame. In accordance with the measurement control of the transmission characteristics and the reception characteristics of the DUT 100 in step S10, in the integrated control device 10, for example, the control unit 22 controls to store the analysis result of the signal under measurement by the NR system simulator 20 in a storage area such as a RAM (not shown) as the transmission characteristics and the reception characteristics at the temperature controlled in step S3.

Subsequently, in the integrated control device 10, for example, the DUT (mentation control unit 17 determines whether or not the measurement of the transmission characteristics and the reception characteristics of the DUT 100 has been completed for all desired orientations for the nth measurement target frequency band (Step S11). Here, when it is determined that the measurement for the nth measurement target frequency band is not completed (NO in step S11), the processing in step S7 and subsequent steps is continued.

Meanwhile, when it is determined that the measurement for the nth measurement target frequency band is completed (YES in step S11), the automatic antenna placement control unit 16 determines whether or not n has reached n=3, which indicates the last measurement target frequency band (in-band 3) (step S12). Hoe, when it is determined that n has not reached 3 (NO in step S12), the automatic antenna placement control unit 16 increments the value of n (step S13) and continues the processing from step S5.

Meanwhile, when it is determined that n=3 has been reached (YES in step S12), the temperature control unit 18 determines whether or not the measurement of the transmission characteristics and the reception characteristics of the DUT 100 has been completed for all the temperatures set in advance by the user (step S14). Here, when it is determined that the measurement for all the temperatures has not been completed (NO in step S14), the temperature control unit 18 continues the processing from step S3.

Meanwhile, when it is determined that the measurement of the transmission characteristics and the reception characteristics of the DUT 100 has been completed for all the temperatures set in advance by the user (YES in step S14), the integrated control device 10 ends the series of measurement processes described above.

In the above embodiment, an example in which the transmission/reception measurement of the DUT 100 in the three bands within the 5G NR band (see FIG. 8) is covered with, for example, the three test antennas 6. The present invention is not limited to this, and the measurement of the transmission characteristics and the reception characteristics of the DUT 100 for a plurality of bands within the 5G NR band may be performed using an arbitrary number of test antennas 6. Further, it is needless to say that the automatic antenna placement unit 60 for automatically arranging the test antenna 6 is not limited to the inode described in the above embodiment, but can be applied with various modes including a means for manually arranging an antenna and a means for fixing a plurality of antennas in the vicinity of the focal position F. The present invention can be applied not only to the anechoic chamber but also to the anechoic box. Further, in the above-described embodiment, the OTA chamber 50 is the chamber adopting the CATR system, but the present invention is not limited to this. The OTA chamber 50 may be a chamber adopting the direct far-field method shown in FIG. 5A.

As described above, in the temperature test apparatus 1 according to the present embodiment, in the region of the heat-insulating housing 70 through which radio waves of a radio signal transmitted from the test antenna 6 passes before entering the quiet zone QZ, a flat plate shaped part 70a perpendicular to the traveling direction of the radio waves of the radio signal entering the quiet zone QZ is formed. As a result, the traveling direction of the radio waves exchanged between the test antenna 6 and the antennas 110 is always perpendicular to the flat plate shaped part 70a of the heat-insulating housing 70 regardless of the position of the antennas 110 in the DUT 100. Here, perpendicular means about 90±10 degrees. Therefore, compared with the case where the traveling direction of the radio waves with respect to the flat plate shaped part 70a of the heat-insulating housing 70 is oblique, the distance through which the radio waves passes through the heat-insulating housing 70 becomes the shortest, and the absolute value of the reflection coefficient is minimum for the TE-polarized component of the plane waves incident on the flat plate shaped part 70a of the heat-insulating housing 70. Therefore, the temperature test apparatus 1 according to the present embodiment can suppress radio wave loss due to absorption and reflection in the heat-insulating housing 70 of radio waves passing through the heat-insulating housing 70, and suppress uncertainty of radio wave intensity due to interference by reflected waves, when measuring the temperature dependence of the transmission characteristics or the reception characteristics of the DUT 100 in the OTA test environment. This allows the temperature test apparatus 1 according to the present embodiment to suppress the deterioration of the measurement results (the deterioration of the Quality of quiet zone) due to the heat-insulating housing 70.

Further, the temperature test apparatus 1 according to the present embodiment is provided with the orientation changing mechanism 56 as a 2-axis positioner, so that the DUT 100 can be sequentially rotated with the center of the DUT 100 as the center of rotation, thereby making it possible to have the antennas 110 oriented in all three-dimensional directions.

Further, the temperature test apparatus 1 according to the present embodiment is provided with the friction reducing parts 75 at a position where the rotating part 73 and the hole part 74 are in contact with each other, so that the temperature test apparatus 1 can prevent the durability of the heat-insulating housing 70 from being deteriorated due to the friction between the rotating part 73 and the hole part 74 during rotation.

Further, the temperature test apparatus 1 according to the present embodiment has the reflector 7 having the predetermined surface shaped as paraboloid of revolution arranged in the radio wave propagation path between the antennas 110 of the DUT 100 and the test antenna 6, so that the OTA test can be executed by the CATR which is more compact than the OTA test in the direct far-field method in which the test antenna 6 and the DUT 100 face each other to transmit and receive signals.

What is claimed is:

1. A temperature test apparatus for measuring temperature dependence of transmission characteristics or reception characteristics of a device under test having one or more antennas under test, the temperature test apparatus comprising:
   an anechoic chamber having an internal space unaffected by a surrounding radio wave environment;
   a test antenna housed in the internal space and configured to transmit or receive a radio signal to or from the antennas under test in order to measure the reception characteristics or the transmission characteristics of the device under test;
   an orientation changing mechanism configured to sequentially change an orientation of the device under test placed in a quiet zone in the internal space so that the antennas under test face in all three-dimensional directions;
   a heat-insulating housing housed in the internal space and made of heat-insulating material surrounding a space region including the quiet zone;
   a temperature control device capable of controlling temperature of the space region; and
   a measuring device configured to measure the transmission characteristics or the reception characteristics of the device under test,
   wherein the heat-insulating housing has a flat plate shaped part in a region through which radio waves of a radio signal transmitted from the test antenna passes before entering the quiet zone, the flat plate shaped part being perpendicular to the traveling direction of the radio waves of the radio signal entering the quiet zone;
   wherein the orientation changing mechanism comprises:
      a drive unit configured to generate rotational driving force;
      a turntable configured to rotate by a predetermined angle around one of two axes that are orthogonal to each other by the rotational driving force of the drive unit;
      a support column extending from the turntable in a direction of the one axis and rotating together with the turntable by the rotational driving force of the drive unit; and
      a DUT mounting part on which the device under test is mounted, which extends from a side surface of the support column in a direction of the other of the two axes, and rotates by a predetermined angle around the other axis by the rotational driving force of the drive unit,
   wherein the device under test, the DUT mounting part, and a part of the support column are accommodated in the space region.

2. The temperature test apparatus according to claim 1, wherein the measuring device measures the transmission characteristics or the reception characteristics of the device under test every time the orientation of the device under test is changed by the orientation changing mechanism while the temperature of the space region is controlled by the temperature control device.

3. The temperature test apparatus according to claim 1, wherein the heat-insulating housing comprises:
   a disk-shaped rotating part having a through hole into which a part of the support column is inserted and rotating together with the turntable and the support column; and
   a hole part having an inner diameter substantially equal to an outer diameter of the rotating part and rotatably accommodating the rotating part;
   wherein friction reducing parts are provided on a side wall surface of the rotating part facing the hole part and on an inner wall surface of the hole part facing the rotating part to reduce friction between the side wall surface and the inner wall surface.

4. The temperature test apparatus according to claim 1, further comprising:
a reflector housed in the internal space and having a predetermined surface shaped as paraboloid of revolution;
wherein the reflector reflects radio waves of a radio signal on the surface shaped as paraboloid of revolution, the radio waves of the radio signal being transmitted and received between the antennas under test and the test antenna arranged at the focal position defined by the paraboloid of revolution.

5. The temperature test apparatus according to claim 2, further comprising:
a reflector housed in the internal space and having a predetermined surface shaped as paraboloid of revolution;
wherein the reflector reflects radio waves of a radio signal on the surface shaped as paraboloid of revolution, the radio waves of the radio signal being transmitted and received between the antennas under test and the test antenna arranged at the focal position defined by the paraboloid of revolution.

6. The temperature test apparatus according to claim 3, further comprising:
a reflector housed in the internal space and having a predetermined surface shaped as paraboloid of revolution;
wherein the reflector reflects radio waves of a radio signal on the surface shaped as paraboloid of revolution, the radio waves of the radio signal being transmitted and received between the antennas under test and the test antenna arranged at the focal position defined by the paraboloid of revolution.

7. A temperature test method using a temperature test apparatus for measuring temperature dependence of transmission characteristics or reception characteristics of a device under test having one or more antennas under test, wherein
the temperature test apparatus comprising:
an anechoic chamber having an internal space unaffected by a surrounding radio wave environment;
a test antenna housed in the internal space and configured to transmit or receive a radio signal to or from the antennas under test in order to measure the reception characteristics or the transmission characteristics of the device under test;
an orientation changing mechanism configured to sequentially change an orientation of the device under test placed in a quiet zone in the internal space so that the antennas under test face in all three-dimensional directions;
a heat-insulating housing housed in the internal space and made of heat-insulating material surrounding a space region including the quiet zone;
a temperature control device capable of controlling temperature of the space region; and
a measuring device configured to measure the transmission characteristics or the reception characteristics of the device under test;
wherein the heat-insulating housing has a flat plate shaped part in a region through which radio waves of a radio signal transmitted from the test antenna passes before entering the quiet zone, the flat plate shaped part being perpendicular to the traveling direction of the radio waves of the radio signal entering the quiet zone,
wherein the orientation changing mechanism comprises:
a drive unit configured to generate rotational driving force;
a turntable configured to rotate by a predetermined angle around one of two axes that are orthogonal to each other by the rotational driving force of the drive unit;
a support column extending from the turntable in a direction of the one axis and rotating together with the turntable by the rotational driving force of the drive unit; and
a DUT mounting part on which the device under test is mounted, which extends from a side surface of the support column in a direction of the other of the two axes, and rotates by a predetermined angle around the other axis by the rotational driving force of the drive unit,
wherein the device under test, the DUT mounting part, and a part of the support column are accommodated in the space region,
the temperature test method comprising:
a temperature control step of controlling the temperature of the space region;
an orientation changing step of sequentially changing the orientation of the device under test placed in the quiet zone; and
a measurement step of measuring the transmission characteristics or the reception characteristics of the device under test every time the orientation of the device under test is changed by the orientation changing step while the temperature of the space region is controlled by the temperature control step.

* * * * *